United States Patent
Kurjanowicz et al.

(10) Patent No.: US 7,764,532 B2
(45) Date of Patent: *Jul. 27, 2010

(54) HIGH SPEED OTP SENSING SCHEME

(75) Inventors: Wlodek Kurjanowicz, Arnprior (CA); Steven Smith, Wakefield (CA)

(73) Assignee: Sidense Corp., Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/389,933

(22) Filed: Feb. 20, 2009

(65) Prior Publication Data

US 2009/0154217 A1    Jun. 18, 2009

Related U.S. Application Data

(63) Continuation of application No. 11/618,330, filed on Dec. 29, 2006, now Pat. No. 7,511,982, which is a continuation-in-part of application No. 10/553,873, filed as application No. PCT/CA2005/000701 on May 6, 2005, now Pat. No. 7,402,855.

(60) Provisional application No. 60/568,315, filed on May 6, 2004.

(51) Int. Cl.
*G11C 17/00* (2006.01)

(52) U.S. Cl. ........................ 365/96; 365/100; 365/225.7

(58) Field of Classification Search .................. 365/96, 365/100, 225.7
See application file for complete search history.

(56) References Cited

U.S. PATENT DOCUMENTS

| 3,423,646 A | 1/1969 | Cubert et al. |
| 3,634,929 A | 1/1972 | Yoshida et al. |
| 4,322,822 A | 3/1982 | McPherson |
| 4,507,757 A | 3/1985 | McElroy |
| 4,543,594 A | 9/1985 | Mohsen et al. |
| 4,823,181 A | 4/1989 | Mohsen et al. |
| 4,899,205 A | 2/1990 | Hamdy et al. |
| 5,019,878 A | 5/1991 | Yang et al. |
| 5,068,696 A | 11/1991 | Yang et al. |

(Continued)

FOREIGN PATENT DOCUMENTS

EP    2122632 A1    11/2009

(Continued)

OTHER PUBLICATIONS

English Translation of Taiwan Patent Application No. 96108282 Office Action dated Jan. 28, 2010.

(Continued)

*Primary Examiner*—Huan Hoang
(74) *Attorney, Agent, or Firm*—Shin Hung; Borden Ladner Gervais LLP

(57) ABSTRACT

A high speed sensing scheme for a non-volatile memory array is disclosed. The memory array includes non volatile memory cells arranged in a complementary bitline configuration includes precharge circuits for precharging the bitlines to a first voltage level such as VSS, a reference circuits for applying a reference charge on the reference bitlines of the complementary bitline pairs, and bitline sense amplifiers for sensing a voltage differential between the complementary bitline pairs. A voltage on the data bitline being changed when a programmed non-volatile memory cell connected to an activated wordline couples the wordline voltage to the data bitline.

8 Claims, 25 Drawing Sheets

U.S. PATENT DOCUMENTS

| | | | |
|---|---|---|---|
| 5,110,754 A | 5/1992 | Lowrey et al. | |
| 5,163,180 A | 11/1992 | Eltoukhy et al. | |
| 5,229,968 A | 7/1993 | Ito et al. | |
| 5,241,496 A | 8/1993 | Lowrey et al. | |
| 5,508,960 A | 4/1996 | Pinkham | |
| 5,627,779 A | 5/1997 | Odake et al. | |
| 5,646,438 A | 7/1997 | Frerichs | |
| 5,672,994 A | 9/1997 | Au et al. | |
| 5,742,555 A | 4/1998 | Marr et al. | |
| 5,896,334 A | 4/1999 | Casper et al. | |
| 5,986,939 A | 11/1999 | Yamada | |
| 6,031,775 A | 2/2000 | Chang et al. | |
| 6,087,707 A | 7/2000 | Lee et al. | |
| 6,400,632 B1 | 6/2002 | Tanizaki et al. | |
| 6,421,293 B1 | 7/2002 | Candelier et al. | |
| 6,424,571 B1 | 7/2002 | Pekny | |
| 6,515,344 B1 | 2/2003 | Wollesen | |
| 6,580,145 B2 | 6/2003 | Wu et al. | |
| 6,594,192 B1 | 7/2003 | McClure | |
| 6,597,234 B2 | 7/2003 | Reber et al. | |
| 6,611,040 B2 | 8/2003 | Geisomini et al. | |
| 6,627,970 B2 | 9/2003 | Fuller et al. | |
| 6,630,724 B1 | 10/2003 | Marr | |
| 6,667,902 B2 | 12/2003 | Peng | |
| 6,671,040 B2 | 12/2003 | Fong et al. | |
| 6,700,151 B2 | 3/2004 | Peng | |
| 6,700,176 B2 | 3/2004 | Ito et al. | |
| 6,713,839 B2 | 3/2004 | Madurawe | |
| 6,753,590 B2 | 6/2004 | Fifield et al. | |
| 6,777,757 B2 | 8/2004 | Peng et al. | |
| 6,856,540 B2 | 2/2005 | Peng et al. | |
| 6,927,997 B2 | 8/2005 | Lee et al. | |
| 6,936,909 B2 | 8/2005 | Marr et al. | |
| 6,940,751 B2 | 9/2005 | Peng et al. | |
| 6,960,819 B2 | 11/2005 | Chen et al. | |
| 7,030,458 B2 | 4/2006 | Marr | |
| 7,101,738 B2 | 9/2006 | Marr et al. | |
| 7,126,871 B2 | 10/2006 | Marr et al. | |
| 7,253,054 B2 | 8/2007 | Mitros et al. | |
| 7,276,775 B2 | 10/2007 | Bertin et al. | |
| 7,402,855 B2 | 7/2008 | Kurjanowicz | |
| 2003/0098495 A1 | 5/2003 | Amo et al. | |
| 2004/0264258 A1 | 12/2004 | Derner et al. | |
| 2005/0007855 A1* | 1/2005 | Lee et al. | 365/225.7 |

FOREIGN PATENT DOCUMENTS

WO      2008077238 A1     7/2008

OTHER PUBLICATIONS

European Patent Application No. 07719435.5 Supplemental Search Report dated Feb. 8, 2010.

\* cited by examiner

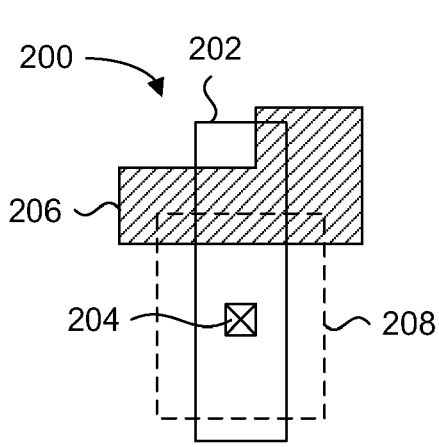
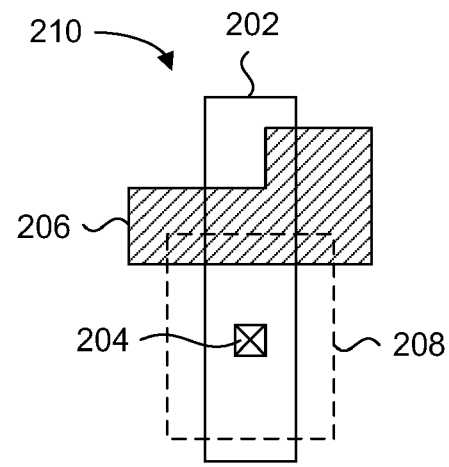
Figure 6a
Figure 6b
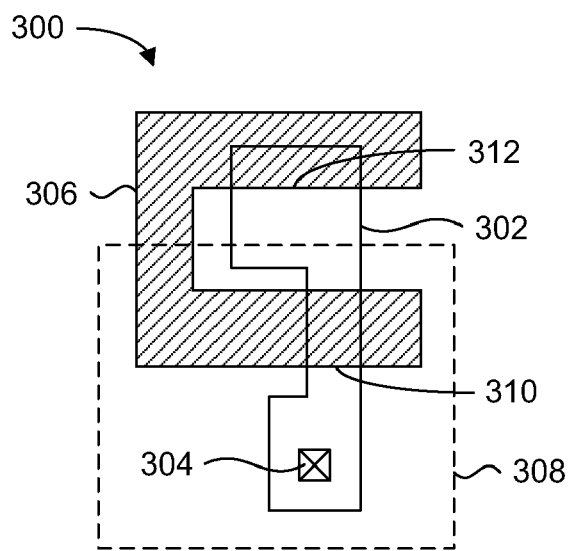
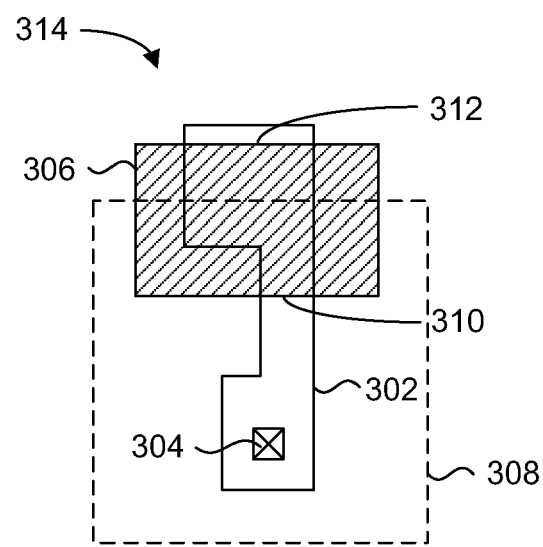
Figure 7a
Figure 7b

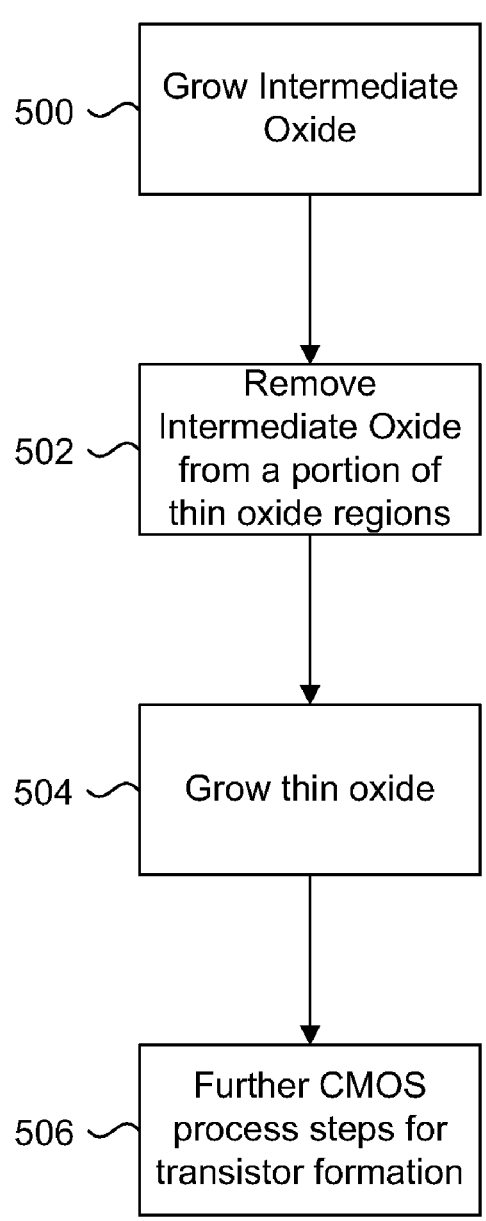
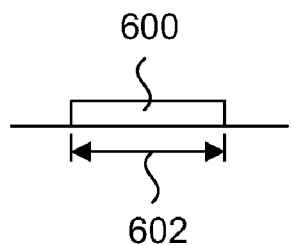
Figure 10a
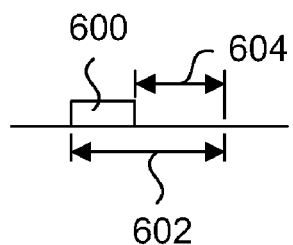
Figure 10b
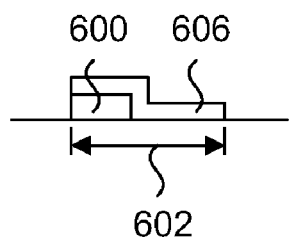
Figure 10c
Figure 9

HIGH SPEED OTP SENSING SCHEME

CROSS REFERENCE TO RELATED APPLICATIONS

This application is Continuation of U.S. patent application Ser. No. 11/618,330 filed on Dec. 29, 2006, now U.S. Pat. No. 7,511,982, which is a Continuation-In-Part (CIP) of U.S. patent application Ser. No. 10/553,873 filed in the United States on Oct. 21, 2005, now U.S. Pat. No. 7,402,855, which is a National Stage Entry of PCT/CA05/00701 filed on May 6, 2005, which claims the benefit of priority of U.S. Provisional Patent Application No. 60/568,315 filed on May 6, 2004.

FIELD OF THE INVENTION

The present invention relates generally to non-volatile memory. More specifically, the invention is directed a sensing scheme for one-time programmable (OTP) memories.

BACKGROUND OF THE INVENTION

Over the past 30 years, anti-fuse technology has attracted significant attention of many inventors, IC designers and manufacturers. An anti-fuse is a structure alterable to a conductive state, or in other words, an electronic device that changes state from not conducting to conducting. Equivalently, the binary states can be either one of high resistance and low resistance in response to electric stress, such as a programming voltage or current. There have been many attempts to develop and apply anti-fuses in microelectronic industry, but the most successful anti-fuse applications to date can be seen in FGPA devices manufactured by Actel and Quicklogic, and redundancy or option programming used in DRAM devices by Micron.

A summary of the progression of anti-fuse development follows as evidenced by issued United States patents.

Anti-fuse technology development started with U.S. Pat. No. 3,423,646 (Cubert et al.), which disclosed a thin film formable diode PROM built as an array of horizontal and vertical conductors with a thin dielectric (aluminium oxide) between the conductors, at their crossings. Such NVM memory was programmed through perforation of the dielectric in some of the crossings. A formable diode would act as an open circuit until a voltage of sufficient magnitude and duration is applied to the crossing to cause forming of the aluminum oxide intermediate layer at which time device would act as a tunneling diode.

U.S. Pat. No. 3,634,929 (Yoshida et al.) disclosed an intermetal semiconductor anti-fuse array, the structure of the anti-fuse consisting of a thin dielectric capacitor (AlO2, SiO2 or Si3N4) utilizing two (Al) conductors located above and connected to the semiconductor diode.

A programmable dielectric ROM memory structure using a MOS capacitor and a MOS switching element was shown in U.S. Pat. No. 4,322,822 (McPherson). This cell was formed as a standard gate-oxide-over-substrate capacitor having a gate connected to a MOS transistor using a buried contact. In order to lower the oxide breakdown voltage, which needed to be smaller for the anti-fuse capacitor then for the MOS switch, a V-shaped grove in the capacitor area was proposed. Since the capacitor was formed between the poly gate and the grounded p-type substrate, the rupture voltage had to be applied to the capacitor through an access transistor. The Gate/Drain and Gate/Source edges of the access transistors were located at the second field oxide, much thicker then the gate oxide in the channel area, which greatly improved Gate/S-D breakdown voltage.

U.S. Pat. No. 4,507,757 (McElroy) proposed a method for lowering gate oxide breakdown voltage through avalanche junction breakdown. Although the original McElroy ideas evolved around using gated diodes to locally induce avalanche breakdown, which in turn lowered dielectric rupture voltage by enhanced electron tunneling, he actually introduced or embodied other and perhaps more important elements to anti-fuse technology: (a) Dual gate oxide anti-fuse: access transistor gate oxide thicker then anti-fuse dielectric. McElroy's dual gate oxide process steps are: initial gate oxidation, etching areas for thinner gate oxide and subsequent gate oxidation. This procedure is now used in standard CMOS technologies for "I/O" and "1T" devices. (b) A "common-gate" (planar DRAM like) anti-fuse connection where access transistor connects to anti-fuse diffusion (Drain) node and all the anti-fuse gates are connected together. This is opposite to McPherson arrangement and results in much denser cell since the buried contact is eliminated. (c) Limiting resistor between common anti-fuse gate and external ground. (d) Two-terminal anti-fuse MOS device (a half transistor): McElroy concluded that only two terminals are needed in anti-fuse capacitor: D and G. The Source is not really needed for anti-fuse programming or operation and can be fully isolated from the active area. The bulk connection does not play any role either except for the avalanche breakdown. So the source role is limited to collecting carriers from the avalanche breakdown should the local substrate potential increase to forward bias the emitter of a parasitic n-p-n device formed by D, B and S.

It wasn't until 1985 when U.S. Pat. No. 4,543,594 (Mohsen) proposed an anti-fuse design suitable for redundancy repair. As such application requires much lower density than PROM, it was easier to supply external high voltage necessary to rupture the oxide without actually passing this voltage through the access transistors. Mohsen's anti-fuse structure consisted of a thin oxide (50-150 A SiO2) polysilicon capacitor over a doped region. He believed that silicon from the substrate or silicon from the electrode where a polysilicon electrode is used melts into pin holes in the insulative layer to provide the conductor, and his test data showed that where the oxide layer is approximately 100 A thick and has an area between 10 to 500 um$^2$, fusion occurred at a voltage of 12 to 16 volts. The current required to cause this fusion is less than 0.1 uA/um2 of capacitor area, and the resulting fused link has a resistance of approximately 0.5 to 2K ohms. A link, once fused, can handle currents of up to 100 milliamps at room temperature for approximately one second before it heals to an open fuse. Taking into account electron migration wear-out, the predicted wear-out lifetime of a link, once fused, is substantially greater than 3E8 hours.

The possibility of anti-fuse self-healing under current stress appeared to be the main roadblock for application of this technology in such areas like PROMs, PLDs and FPGAs, where constant fuse stress was required. The anti-fuse healing problem was resolved later by Mohsen and others at Actel in U.S. Pat. No. 4,823,181. Actel teaches the way to implement a reliable programmable low impedance anti-fuse element by using an ONO structure instead of silicon dioxide. Actel's method required an ohmic contact after dielectric rupture. This was achieved either by using heavily doped diffusion, or by putting an ONO dielectric between two metal electrodes (or silicide layers). The necessity of an Arsenic doped bottom diffusion electrode was revised later in U.S. Pat. No. 4,899, 205 (Hamdy et al.), where it was allowed for either top-poly or bottom-diffusion to be highly doped.

U.S. Pat. No. 5,019,878 (Yang et al.) taught that if the drain is silicided, the application of a programming voltage in the range of ten to fifteen volts from the drain to the source reliably forms a melt filament across the channel region. A gate voltage may be applied to control the specific transistors to melt. IBM discovered similar effect by proposing a channel anti-fuse in U.S. Pat. No. 5,672,994 (Au et al.). They discovered that with 0.5 um technology, the BVDSS for the nmos transistor is not only in the order of 6.5V, but once the S-D punch through occurs it creates permanent damage resulting in few kilo ohms leakage between the source and the drain.

U.S. Pat. Nos. 5,241,496 and 5,110,754 to Micron, disclosed a DRAM cell based anti-fuse (trench and stack). In 1996, Micron introduced a well-to-gate capacitor as an anti-fuse in U.S. Pat. No. 5,742,555 (Marr et al.). U.S. Pat. No. 6,087,707 (Lee et al.) proposed an N-Well coupled anti-fuse as a way to eliminate undercut defects associated with polysilicon etching. U.S. Pat. No. 6,421,293 (Chandelier et al.) proposed a similar anti-fuse structure, but with n+ regions removed to create an asymmetrical ("unbalanced") high voltage access transistor using the N-well as a drain electrode.

U.S. Pat. No. 6,515,344 (Wollesen) proposed a range of P+/N+ anti-fuse configurations, implemented using a minimum size gate between two opposite type diffusion regions.

NMOS anti-fuses have been built in an isolated P-well using a standard Deep N-Well process. An example of Deep N-Well based anti-fuses is disclosed in U.S. Pat. No. 6,611,040 (Geisomini et al.).

U.S. Pat. Nos. 6,960,819 (Chen et al.) and 6,700,176 (Ito et al.) disclose other Deep N-Well anti-fuses. These anti-fuses consisted of a capacitor featuring direct tunneling current rather then Fowler Nordheim current. These applications confirm that anti-fuse performance is generally improved for thinner gate oxide capacitors (approx 20 A, which is typical for transistors in 0.13 um process).

U.S. Pat. No. 6,580,145 (Wu et al.) disclosed a new version of a traditional anti-fuse structure utilizing dual gate oxides, with the thicker gate oxide being used for nmos (or pmos) access transistors and the thinner gate oxide for the capacitor. The N-Well (or P-Well) is used as a bottom plate of the anti-fuse capacitor.

The idea of creating a source drain short through the gate by separately breaking the S-G and D-G dielectric regions of the transistor is disclosed in U.S. Pat. No. 6,597,234 (Reber et al.).

U.S. Pat. No. 6,753,590 (Fifield et al.) disclosed an anti-fuse built from a MOS transistor having gate connected to the gate of a capacitor, degenerated by a thinner gate oxide and heavy doping under the channel through additional implantation (a diode). The rupture voltage is applied to a bottom plate of the capacitor.

In U.S. Pat. No. 6,667,902 (Peng), Peng attempts to improve a classic planar DRAM-like anti-fuse array by introducing "row program lines" which connect to the capacitors and run parallel to the word lines. If decoded, the row program lines can minimize exposure of access transistors to a high programming voltage, which would otherwise occur through already programmed cells. Peng and Fong further improve their array in U.S. Pat. No. 6,671,040 (Fong et al.) by adding a variable voltage controlling programming current, which allegedly controls the degree of gate oxide breakdown, allowing for multilevel or analog storage applications.

Most recently, U.S. Pat. No. 6,777,757 (Peng) shows a memory array using a single transistor structure. In the proposed memory cell, Peng eliminates the LDD diffusion from a regular NMOS transistor. A cross-point array structure is formed of horizontal active area (S/D) stripes crossing vertical poly gate stripes. Drain contacts are shared between neighbouring cells and connected to horizontal wordlines. Source regions are also shared and left floating. Peng assumes that if the LDD diffusion is omitted, the gate oxide breakdown location will be far enough from the drain area and a local N+ region will be created rather than D-G (drain-gate) short. If such a region was created, the programmed cells could be detected by positively biasing the gate and sensing the gate to drain current. In order to reduce the G-D or S-D (source-drain) short probability, Peng proposes increasing gate oxide thickness at the G-D and S_D edges through modification of a gate sidewall oxidation process. Peng's array requires that both source and drain regions be present in the memory cells, row wordlines coupled to transistor drain regions, and the column bitlines formed from transistor gates. Such an unusual connection must be very specific to Peng's programming and reading method, requiring a decoded high voltage (8V in 1.8V process) applied to all drain lines except for the one to be programmed. The decoded high voltage (8V) is applied to the gates of the column to be programmed, while the other gates are kept at 3.3V.

Although Peng achieves a cross-point memory architecture, his array requires CMOS process modifications (LDD elimination, thicker gate oxide at the edge) and has the following disadvantages: (a) All row decoders, column decoders and sense amplifiers must switch a wide range of voltages: 8V/3.3V/0V or 8V/1.8V/0V. (b) During a program operation, the 3.3V column drivers are effectively shorted to 8V row drivers or 0V drivers through programmed cells. This puts many limits on the array size, affects driver size and impacts reliability and effectiveness of programming. (c) Every program operation requires that all the array active areas (except for the programmed row) are biased at 8V. This leads to large N++ junction leakage current, and again limits array size. (d) The gate oxide breaking spot is assumed to be located far enough from the drain area so the punch through is not happening at 8V bias. At the same time, the transistor must operate correctly at 1.8V biasing—connecting to the channel area. This is not achievable without significant process modification. (e) Peng assumes that the gate oxide will not break on the source or drain edge if the LDD is not present. It is however known in the art that the S/D edges are the most likely locations for the oxide breakdown because of defects and electric field concentration around sharp edges.

Peng attempts to solve some of the high voltage switching problems in U.S. Pat. No. 6,856,540 (Peng). The high blocking voltage on wordlines and bitlines is now replaced with "floating" wordlines and bitlines, and restrictions on the distance from the channel to the source and drain regions has been changed. Although floating wordlines and bitlines may ease problems with high voltage switching, they do not solve any of the above mentioned fundamental problems. Additionally they introduce severe coupling problems between the switched and the floating lines.

Today, anti-fuse developments concentrate around 3-dimensional thin film structures and special inter-metal materials. All these anti-fuse technologies require additional processing steps not available in standard CMOS process, prohibiting anti-fuse applications in typical VLSI and ASIC designs, where programmability could help overcome problems with ever shrinking device life cycles and constantly rising chip development costs. Therefore there is an apparent need in the industry for a reliable anti-fuse structures utilizing standard CMOS process.

Prior art anti-fuse cells and arrays either require special processing steps or suffer from high voltage exposure of MOS switching elements, leading to manufacturability and reliability problems. They are also limited to low density memory applications, with the exception of Peng's single transistor cell, which in turn has very doubtful manufacturability.

A significant issue with current non-volatile memories, such as Flash and OTP memories, is the speed at which data states of the memory cells can be sensed, which directly impacts overall performance of the memory. Performance of a memory, either embedded in a system or as a discrete memory device, can be the performance bottleneck for the system it is part of, relative to other processes executed by the system.

Non-volatile memories, such as Flash memories and OTP memories, use current sensing schemes as is well known in the art. These schemes are typically single ended, meaning that a sense amplifier circuit compares the current driven through one bitline which carries data of a memory cell connected to it, with a reference current. The reference current can be generated in a variety of ways, including synthesis by a reference voltage generator, or through a reference memory cell. The single bit digital output from a current sense amplifier represents the state of the bitline current relative to the reference current. In Flash memory, the current of a bitline will depend on the programmed threshold value of the memory cell. In an anti-fuse OTP memory, the current of a bitline will depend on the conductivity of the formed anti-fuse link.

Unfortunately, current sensing schemes are relatively slow. DRAM sensing on the other hand is much faster than current sensing schemes, since a voltage or charge is sensed on the bitlines. DRAM memories are organized in a folded bitline architecture, where pairs of bitlines are connected to their own bitline sense amplifier. Both bitlines (complementary) are precharged to some mid-point voltage level prior to a read operation, then a memory cell will either add to or remove charge from, one of the bitlines. Even a small voltage differential between the folded bitlines can be quickly detected by the bitline sense amplifier.

DRAM provides an optimal balance between high density and performance, which is why it is exclusively used for computer systems with ever-increasing demands for capacity and performance. In contrast, current anti-fuse OTP memories are relatively slow, but have useful non-volatile applications where DRAM is unsuitable or impractical to manufacture. Applications include onboard FLASH replacement, boot and processor code storage, PROM, EEPROM and EPROM replacement, MASK ROM replacement, and other applications where data must be securely retained in the absence of power. Unfortunately, even for such applications, the relatively slow performance of anti-fuse OTP memories can negatively impact the performance of the system that relies on the anti-fuse OTP memory, whether it is a set-top box, PDA, or cell phone.

It is, therefore, desirable to provide a simple and reliable, high density, anti-fuse array architecture suitable for implementation in standard CMOS technology, with high speed sensing performance.

SUMMARY OF THE INVENTION

It is an object of the present invention to obviate or mitigate at least one disadvantage of the previous non-volatile sensing schemes In particular, it is an object of the present invention to provide circuits and methods for high speed sensing of non-volatile memories, and more specifically, for anti-fuse OTP memories.

In a first aspect, the present invention provides a memory array including one-time-programmable (OTP) memory cells. The memory array includes a pair of complementary bitlines, a precharge circuit, wordlines connected to gate terminals of the OTP memory cells, and a bitline sense amplifier. Each bitline of the pair of complementary bitlines is connected to diffusion terminals of the OTP memory cells. The precharge circuit precharges the pair of complementary bitlines to a first voltage level. The wordlines are connected to gate terminals of the OTP memory cells, and at least one wordline is capable of driving one bitline of the pair of complementary bitlines to a second voltage level through a programmable conductive link of a corresponding OTP memory cell. The bitline sense amplifier senses a voltage differential on the pair of complementary bitlines.

According to an embodiment of the present aspect, the precharge circuit can include a column precharge devices for selectively precharging bitlines adjacent to each bitline of the pair of complementary bitlines to a third voltage level different than the first voltage level. In further embodiments, each of the OTP memory cells can be a single transistor anti-fuse memory cell or a two transistor anti-fuse memory cell. The two transistor anti-fuse memory cell has an access transistor connected to the wordline and an anti-fuse device connected to the access transistor. The antifuse device has a gate connected to a secondary wordline, where the wordline and the secondary wordline are connected together electrically or logically during a read operation.

In yet another embodiment of the present aspect, the memory array further includes a reference circuit for selectively providing a reference charge to one bitline of the pair of complementary bitlines. The reference circuit can include a charge storage capacitor circuit and steering circuits for coupling the charge storage capacitor circuit to the one bitline of the pair of complementary bitlines. The steering circuits can include dummy memory cells for selectively coupling the charge storage capacitor to the one bitline of the pair of complementary bitlines. Furthermore, the reference circuit can include a plurality of additional capacitor circuits connected to the charge storage capacitor circuit, where each of the additional capacitor circuits is selectively enabled in response to a corresponding control signal.

In a further embodiment of the present aspect, the memory array further includes a reference circuit for selectively coupling a capacitive load means to one bitline of the pair of complementary bitlines during a bitline sensing operation. The reference circuit can include a steering circuit for coupling the capacitive load means to the one bitline of the pair of complementary bitlines during a bitline precharge operation.

In a second aspect, the present invention provides a method for sensing one time programmable (OTP) memory cells connected to complementary bitlines. The method includes a) precharging a pair of complementary bitlines to a first voltage level, the pair of complementary bitlines including a data bitline and a reference bitline; b) driving at least one wordline to a second voltage level; c) charging the data bitline towards the second voltage with an OTP memory cell connected to the wordline if the OTP memory cell is programmed; and, d) sensing a voltage difference between the reference bitline and the data bitline.

According to an embodiment of the present embodiment, the step of driving at least one wordline includes driving a first wordline corresponding to a first OTP memory cell connected to the data bitline and driving a second wordline corresponding to a second OTP memory cell connected to the data bitline. Alternately, the step of driving at least one wordline includes driving a first wordline corresponding to a first OTP memory cell connected to the data bitline and driving a second wordline corresponding to a second OTP memory cell connected to the reference bitline. Alternately, the step of driving at least one wordline includes driving a first wordline corresponding to a first OTP memory cell connected to the data bitline, driving a second wordline corresponding to a second OTP memory cell connected to the data bitline, driving a third wordline corresponding to a third OTP memory cell connected to the reference bitline, and driving a fourth wordline corresponding to a fourth OTP memory cell connected to the reference bitline.

In further embodiments, the method includes a step of adding a reference charge to one of the data bitline and the reference bitline, and the step of precharging includes precharging bitlines adjacent to each bitline of the pair of complementary bitlines to a third voltage level. The first voltage level is one of a chip supply voltage and a ground voltage, and the second voltage level is a predetermined magnitude effective for switching a programmed OTP memory cell into a conductive state. The second voltage level and the third voltage level can be both greater than or less than the first voltage level.

Further embodiments of the present aspect are now described. The at least one wordline is driven and the reference charge is added at substantially the same time. The step of adding a reference charge can include activating a steering device for coupling the reference charge to one of the data bitline and the reference bitline, the reference charge being provided by a charge storage means. The charge storage means can be precharged prior to the step of activating the steering device, and the steering device can include a steering transistor. The steering device can include a dummy OTP memory cell, and the charge storage means can be precharged prior to the step of activating the steering device and for a predetermined period of time after the steering device is activated. The steering device can be disabled before a sense amplifier is activated for sensing the voltage difference. The step of adding a reference charge includes selectively coupling at least one supplemental charge storage means in addition to a default charge storage means, the reference charge being provided by the default charge storage means.

In a third aspect, the present invention provides a method for sensing one time programmable (OTP) memory cells connected to a pair of complementary bitlines, the pair of complementary bitlines including a data bitline and a reference bitline. The method includes a) coupling capacitance means to the data bitline, said capacitance means defining an offset of a sense amplifier; b) precharging the data bitline and the reference bitline to a first voltage level; c) driving a wordline to a second voltage level; d) charging the data bitline towards the second voltage level with an OTP memory cell connected to the wordline if the OTP memory cell is programmed, and, e) activating the sense amplifier to determine a voltage difference between the data bitline and the reference bitline.

In embodiments of the present aspect, the step of precharging can include precharging bitlines adjacent to the data bitline and the reference bitline to a third voltage level, and the step of coupling can include activating a steering device for coupling the capacitance means to the data bitline.

In a fourth aspect, the present invention provides a complementary bitline memory array. The complementary bitline memory array includes one time programmable (OTP) memory cells connected to bitlines and wordlines, a first precharge circuit, a second precharge circuit, and a sense amplifier. The first precharge circuit selectively precharges a selected complementary bitline pair to a first voltage level. The second precharge circuit selectively precharges bitlines adjacent to the selected complementary bitline pair to a second voltage level. The sense amplifier is coupled to the selected complementary bitline pair through column select devices in response to decoded column address signals. In an embodiment of the present aspect, the first precharge circuit and the second precharge circuit are turned off to float the selected complementary bitlines and the bitlines adjacent to the selected complementary bitlines before activation of at least one wordline or immediately after activation of the at least one wordline.

In a fifth aspect, the present invention provides a method for precharging a complementary bitline memory array having one time programmable (OTP) memory cells. The method includes a) precharging selected bitline pairs to a first voltage level; b) precharging unselected bitlines adjacent to the selected bitline pairs to a second voltage level; c) driving at least one wordline connected to the OTP memory cells, the OTP memory cells being able to charge one bitline of each of the selected bitline pairs towards the wordline voltage level if the OTP memory cells are programmed, while the driving ability of the OTP memory cells connected to the bitlines precharged to the second voltage level is suppressed.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 6a and 6b are planar layouts of an alternate anti-fuse transistor according to an embodiment of the present invention;

FIGS. 7a and 7b are planar layouts of an alternate anti-fuse transistor according to an embodiment of the present invention;

FIG. 9 is a flow chart of a method for forming a variable thickness gate oxide for the anti-fuse transistor of the present invention;

FIG. 10a-10c illustrate the formation of the variable thickness gate oxide in accordance with steps of the flow chart of FIG. 9;

FIG. 17b is a timing diagram showing signal transitions in accordance with the method described in FIG. 17a;

FIG. 19b is a timing diagram showing signal transitions in accordance with the method described in FIG. 19a;

FIG. 22b is a timing diagram showing signal transitions in accordance with the method described in FIG. 22a;

DETAILED DESCRIPTION

Generally, the present invention provides an array of non-volatile memory cells arranged in a complementary bitline configuration following a folded or an open bitline architecture. The following description specifically refers to the preferred folded bitline arrangement, but it equally applies to the alternative open bitline arrangement or to combinations of the two. The memory array further includes precharge circuits for precharging the bitline pairs to a voltage reference, a reference circuit for injecting a reference charge on one bitline of each bitline pair, and bitline sense amplifiers for sensing a voltage differential between said bitline pairs. The voltage differential will depend on the programming state of the non-volatile memory cells coupled to the bitlines through an activated wordline.

Prior to a discussion of the folded bitline anti-fuse memory array embodiments, following is a description of the preferred anti-fuse memory cell to be used in the embodiments of the present invention. The preferred anti-fuse memory cell is used here as an example only, as many other non-volatile memory (NVM) cells can be utilized with the embodiments of the present invention. Other NVM cells can include two-transistor or 1.5-transistor anti-fuse memory cells. In the following description the term MOS is used to denote any FET or MIS transistor, half-transistor or capacitor structure.

Figure 1:
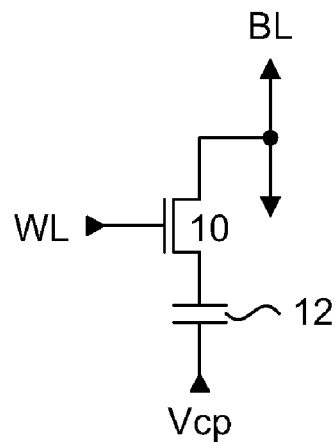
FIG. 1 is a circuit diagram of a DRAM-type anti-fuse cell.
Figure 2:
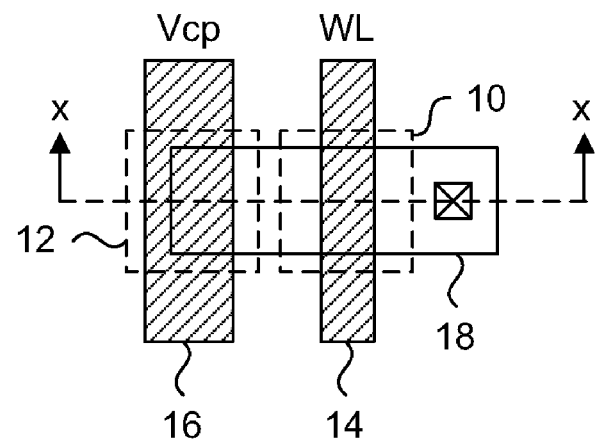
FIG. 2 is a planar layout of the DRAM-type anti-fuse cell of FIG. 1.
Figure 3:
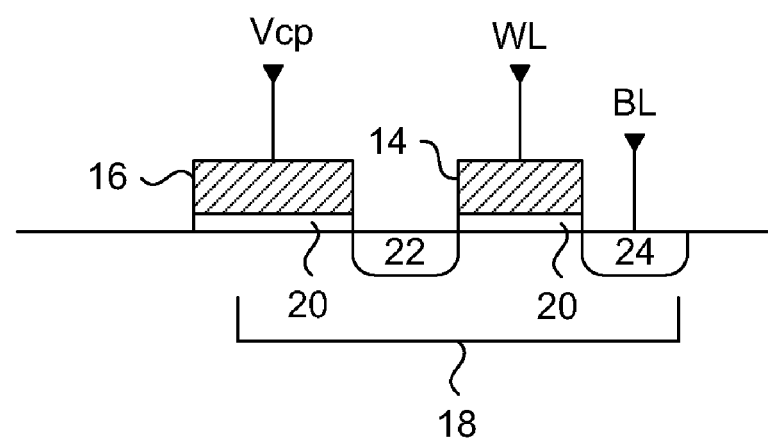
FIG. 3 is a cross-sectional view of the DRAM-type anti-fuse cell of FIG. 2 along line x-x.

As previously discussed, a DRAM-type memory array using a planar capacitors as an anti-fuse instead of as a storage capacitor is already known, as demonstrated in U.S. Pat. No. 6,667,902. FIG. 1 is a circuit diagram of such a memory cell, while FIGS. 2 and 3 show the planar and cross-sectional views respectively, of the known anti-fuse memory cell of FIG. 1. The memory cell of FIG. 1 includes a pass, or access transistor 10 for coupling a bitline BL to a bottom plate of anti-fuse device 12. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer, is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses must be reliable while simple to manufacture with a low cost CMOS process.

Figure 4:
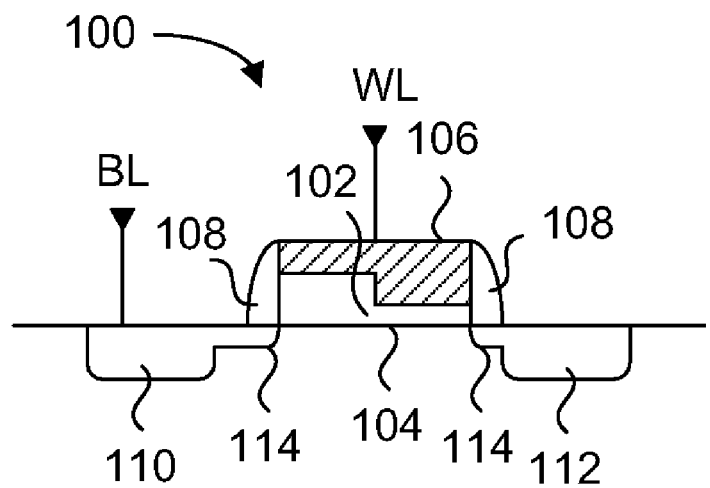
FIG. 4 is a cross-sectional view of an anti-fuse transistor according to an embodiment of the present invention.

According to an embodiment of the present invention, FIG. 4 shows a cross-sectional view of an anti-fuse transistor that can be manufactured with any standard CMOS process. In the presently shown example, the anti-fuse transistor is almost identical to a simple thick gate oxide, or input/output MOS transistor with one floating diffusion terminal. The disclosed anti-fuse transistor, also termed a split-channel capacitor or a half-transistor, can be reliably programmed such that the fuse link between the polysilicon gate and the substrate can be predictably localized to a particular region of the device. The cross-section view of FIG. 4 is taken along the channel length of the device, which in the presently described embodiment is a p-channel device. Those of skill in the art will understand that the present invention can be implemented as an n-channel device.

Anti-fuse transistor 100 includes a variable thickness gate oxide 102 formed on the substrate channel region 104, a polysilicon gate 106, sidewall spacers 108, first and second diffusion regions 110 and 112 respectively, and LDD regions 114 in each of the diffusion regions 110 and 112. The variable thickness gate oxide 102 consists of a thick oxide and a thin gate oxide such that a portion of the channel length is covered by the thick gate oxide and the remaining portion of the channel length is covered by the thin gate oxide. Generally, the thin gate oxide edge meeting diffusion region 112 defines a fusible edge where oxide breakdown can occur. The thick gate oxide edge meeting diffusion region 110 on the other hand, defines an access edge where gate oxide breakdown is prevented and current between the gate 106 and diffusion region 110 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In a preferred embodiment, the diffusion region 110 is connected to a bitline through a bitline contact (not shown), or other line for sensing a current from the polysilicon gate 106, and can be doped to accommodate programming voltages or currents. This diffusion region 110 is formed proximate to the thick oxide portion of the variable thickness gate oxide 102, while optional diffusion region 112 can be left floating. To further protect the edge of anti-fuse transistor 100 from high voltage damage, or current leakage, a resistor protection oxide (RPO), also known as a salicide protect oxide, can be introduced during the fabrication process to further space metal particles from the edge of sidewall spacer 108. This RPO is preferably used during the salicidiation process for preventing only a portion of diffusion region 110 and a portion of polysilicon gate 106 from being salicided.

It is well known that salicided transistors are known to have higher leakage and therefore lower breakdown voltage. Thus having the optional diffusion region 112 salicided will enhance oxide breakdown during programming, yet having a non-salicided diffusion region 110 will reduce leakage. Diffusion region 110 and optional diffusion region 112 can be doped for low voltage transistors or high voltage transistors or a combination of the two resulting in same or different diffusion profiles.

Figure 5:
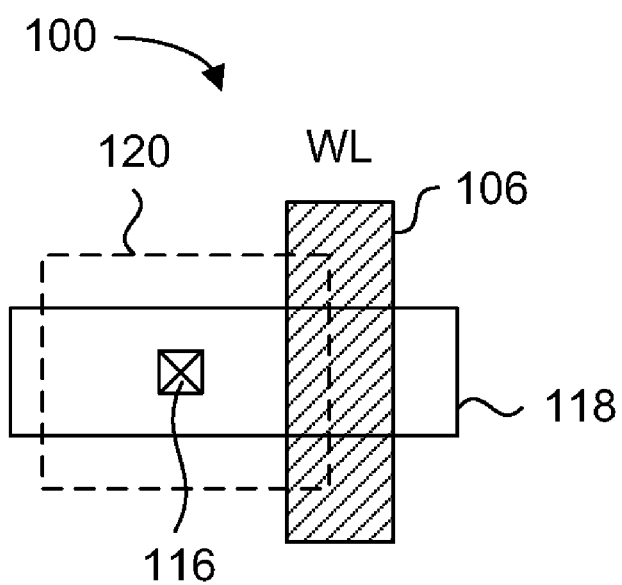
FIG. 5 is a planar layout of the anti-fuse transistor of FIG. 4.

A simplified plan view of the anti-fuse transistor 100 is shown in FIG. 5. Bitline contact 116 can be used as a visual reference point to orient the plan view with the corresponding cross-sectional view of FIG. 4. The active area 118 is the region of the device where the channel region 104 and diffusion regions 110 and 112 are formed, which is defined by an OD mask during the manufacturing process. The dashed outline 120 defines the areas in which the thick gate oxide is to be grown via an OD2 mask during the manufacturing process. OD simply refers to an oxide definition mask that is used during the CMOS process for defining the regions on the substrate where the oxide is to be formed, and OD2 refers to a second oxide definition mask different than the first. Details of the CMOS process steps for fabricating anti-fuse transistor 100 will be discussed later. It should be noted that floating diffusion region 112 is an optional structure for anti-fuse transistor 100 that can be used to enhance the probability of thin gate oxide breakdown, as will be discussed later.

Programming of anti-fuse transistor 100 is based on gate oxide breakdown to form a permanent link between the gate and the channel underneath. Gate oxide breakdown conditions (voltage or current and time) depend primarily on i) gate dielectric thickness and composition, ii) defect density, and iii) gate area, gate/diffusion perimeter. The combined thick and thin gate oxide of anti-fuse transistor 100 results in a locally lowered gate breakdown voltage, in particular an oxide breakdown zone, in the thin gate oxide portion of the device. In otherwords, the disclosed structure assures that the oxide breakdown is limited to the thinner gate oxide portion.

Additionally, the anti-fuse transistor embodiments of the present invention take advantage of a typically prohibited CMOS manufacturing design rule for gate oxide design layout and formation to enhance gate oxide breakdown performance. All gate oxide processing steps in today's CMOS processes assume and are optimized for uniform gate oxide thickness within the active gate area. By introducing the variable thickness gate oxide devices into the standard CMOS flow, additional defects and electrical field disturbances are created at the boundary between the thick and thin gate oxides. Those defects may include, but are not limited to: oxide thinning, plasma etching of silicon at the boundary, residues from cleaning process and silicon recess due to different thermal oxidation rates between unmasked and partially masked regions. All these effects increase trap and defect density at the thin oxide boundary, leading to increased leakage and locally lowered breakdown voltage. Therefore, a low voltage, compact anti-fuse structure can be created without any process modification.

While the anti-fuse transistor described above is suitable for OTP memory array applications due to its compact size, additional modifications can be made to anti-fuse transistor 100 to further increase thin oxide breakdown probability. As mentioned above, gate area, gate/diffusion perimeter is a factor that can increase the probability of thin gate oxide breakdown. To incorporate this breakdown mechanism, the previously shown floating diffusion region 112 can be added to the anti-fuse transistor structure, and the floating diffusion/gate perimeter is preferably increased by incorporating multiple line segments and angles to the diffusion/gate boundary. Further breakdown enhancement can be achieved by heavily doping floating diffusion region 112 to a concentration similar to diffusion regions of the high voltage transistors.

In a typical CMOS process, the diffusion regions, LDD and channel implantation are different for thin gate oxide transistors and thick gate oxide transistors. According to an embodiment of the present invention, the diffusion regions, LDD and the thin gate oxide channel implantation of the anti-fuse transistors can be either type; the low voltage type corresponding to the thin gate oxide, or the high voltage type corresponding to the thick gate oxide (I/O oxide), or both, provided that the resulting thin gate oxide threshold voltage is not greater in magnitude than the thick gate oxide threshold voltage.

Figure 8:
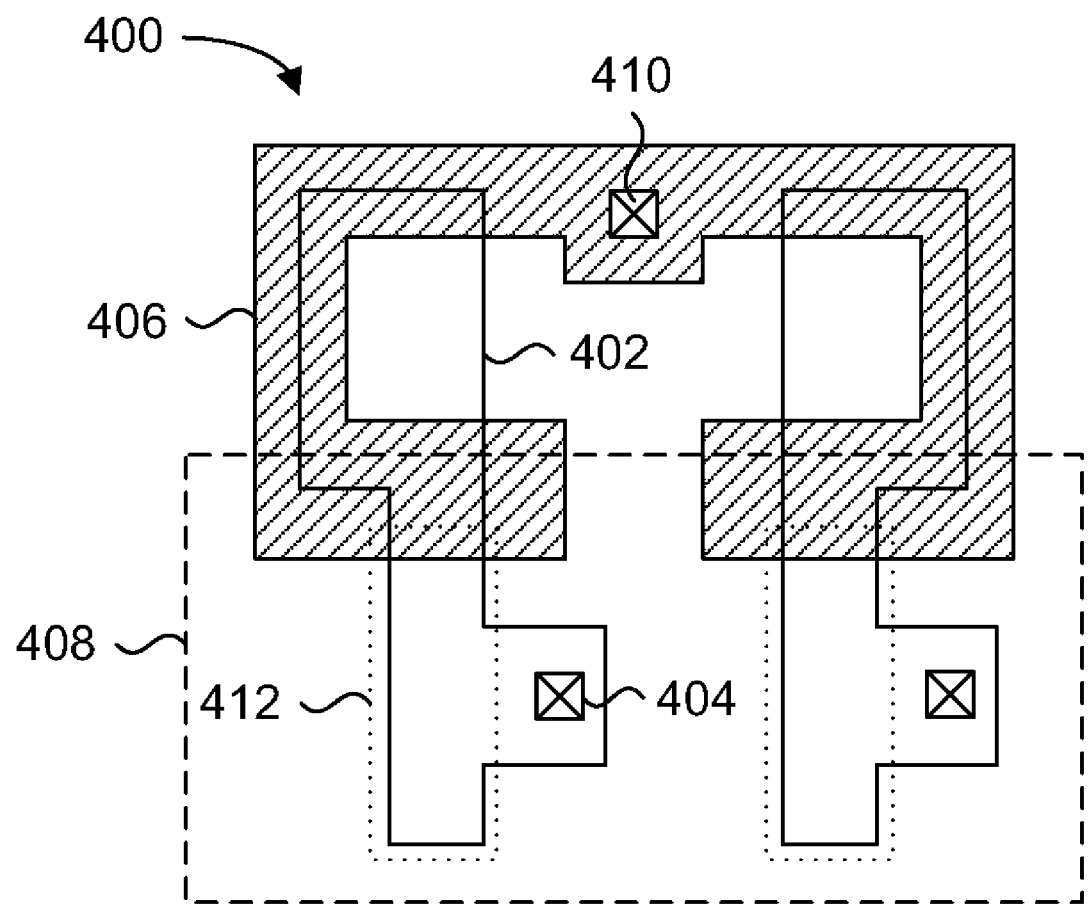
FIG. 8 is a planar layout of an alternate anti-fuse transistor according to an embodiment of the present invention.

Embodiments of the anti-fuse transistor employing increased floating diffusion region perimeter are shown in FIGS. 6-8.

FIG. 6a shows an anti-fuse transistor 200 having an "L" shaped gate/diffusion perimeter, also referred to as the fusible edge, at the floating diffusion end of the device. Anti-fuse transistor 200 is essentially the same as anti-fuse transistor 100 shown in FIGS. 4 and 5. An active region 202 has a diffusion region with bitline contact 204, and a polysilicon gate 206 formed over a variable thickness gate oxide layer (not shown). The OD2 mask 208 defines where the thick gate oxide is formed underneath polysilicon gate 206. In the present embodiment, the floating diffusion region, channel region, and polysilicon gate share a common "L" shaped edge. The edge consists of two edge segments oriented at an angle with respect to each other. While the presently shown embodiment shows the angle to be about 90 degrees, the angle can be set to 135 degrees if desired.

FIG. 6b shows an anti-fuse transistor 210 having a straight "S" shaped gate/diffusion perimeter, also referred to as the fusible edge, at the floating diffusion end of the device. Anti-fuse transistor 210 is essentially the same as anti-fuse transistor 200 shown in FIG. 6a. An active region 202 has a diffusion region with bitline contact 204, and a polysilicon gate 206 formed over a variable thickness gate oxide layer (not shown). The OD2 mask 208 defines where the thick gate oxide is formed underneath polysilicon gate 206. In the present embodiment, the floating diffusion region, channel region, and polysilicon gate share a common straight "S" shaped edge. The edge consists of three edge segments oriented at 90 degree angles with respect to each other.

FIGS. 6a and 6b illustrate examples where the polysilicon gate can be shaped to increase the floating diffusion region perimeter. FIGS. 7a and 7b illustrate examples where the diffusion region and/or the polysilicon gate can be shaped to increase the floating diffusion region perimeter.

In FIG. 7a, anti-fuse transistor 300 has a straight gate/diffusion perimeter at the floating diffusion end of the device. A shaped active region 302 has a diffusion region with bitline contact 304, and a polysilicon gate 306 formed in a "U" shape over the shaped active region 302. The OD2 mask 308 defines where the thick gate oxide is formed underneath polysilicon gate 306. Due to the narrowed active region 302, a portion of polysilicon gate 306 will form an access edge 310 that is substantially smaller in perimeter than fusible edge 312 defined by another portion of polysilicon gate 306. In this particular example, the polysilicon gate is effectively divided into two portions that are coupled to each other. The first portion forms a channel in the active area between the diffusion region with bitline contact 304, while the second portion is positioned adjacent to the floating diffusion region. The first portion is formed over thick gate oxide and the second portion is formed over thin gate oxide.

In FIG. 7b, anti-fuse transistor 314 has a straight gate/diffusion perimeter at the floating diffusion end of the device. A shaped active region 302 has a diffusion region with bitline contact 304, and a straight polysilicon gate 306 formed over the shaped active region 302. The OD2 mask 308 defines where the thick gate oxide is formed underneath polysilicon gate 306. Due to the narrowed active region 302, a portion of polysilicon gate 306 will form an access edge 310 that is substantially smaller in perimeter than fusible edge 312 defined by another portion of polysilicon gate 306.

Therefore, as shown in FIGS. 6a, 6b, 7a and 7b, the perimeter fusible edge can be increased with a combination of polysilicon gate and active area shaping to enhance thin oxide breakdown during programming operations.

FIG. 8 shows a pair of anti-fuse transistors, of which only one will be described as both are substantially symmetrical to each other. Anti-fuse transistor 400 has an active region 402 with a diffusion region with bitline contact 404. A polysilicon gate 406 formed over a variable thickness gate oxide layer (not shown). The OD2 mask 408 defines where the thick gate oxide is formed underneath polysilicon gate 406. In the present embodiment, the floating diffusion region, channel region, and polysilicon gate share a common straight "U" shaped edge. A polysilicon contact 410 is used to make electrical contact with a metal wordline. The diffusion region containing the bitline contacts 404 are oriented as shown to allow for sufficient spacing of RPO 412 from the respective contacts 404. The applicability of the paired anti-fuse transistors shown in FIG. 8 will be described later with regards to folded bitline sensing architectures.

While not shown in FIGS. 6a, 6b, 7a and 7b, an RPO can be used to ensure that the diffusion regions with the bitline contact and a portion of the polysilicon gate is free from salicidation.

A method of creating a variable thick gate oxide from a standard CMOS process according to an embodiment of the present invention, is to utilize a well known two-step oxidation process. A flow chart outlining this process is shown in FIG. 9, while FIGS. 10a-10c show the various stages of the variable thickness gate oxide formation corresponding to specific steps in the process.

First, an intermediate gate oxide is grown in all active areas determined by the OD mask in step 500. In FIG. 10a, this is shown as the formation of intermediate gate oxide 600 on the substrate, over the channel region 602. In following step 502, the intermediate gate oxide 600 is removed from all the designated thin gate oxide areas using an OD2 mask. FIG. 10b shows the remaining portion of intermediate gate oxide 600 and the future thin oxide area 604. In the last gate oxide formation step 504, a thin oxide is grown again in all active areas as originally defined by the OD mask. In FIG. 10c, the thin gate oxide 606 is grown over the intermediate gate oxide 600 and the thin oxide area 604.

As a result, the area covered by the OD2 mask during step 502 will have a gate oxide thickness being a combination of the intermediate gate oxide 600 and the final thin gate oxide 606. The same procedure can be extended for more than two oxidation steps, or other equivalent procedures can be used to produce two or more gate oxide thicknesses on the same die, which is determined by at least one thick gate oxide mask OD2.

Typically, the OD2 mask is considered a non-critical masking step, a low resolution mask is used and the design rules require a large margin of the OD2 mask over active gate areas and particularly, do not have provisions for the OD2 mask ending within the active gate area. According to the present invention, the OD2 mask ends within the active gate area creating a split-channel anti-fuse structure that features thicker gate oxide on the drain (i.e. diffusion contact) side and thinner gate oxide on the opposite side (either channel or non-connected source side). In principle, this technology requires that the gate length (polysilicon line width) should be larger then the process minimum and depends on actual OD2 mask tolerances, but otherwise does not require any process or mask grade change. The minimum gate length for the split channel anti-fuse structure can be approximated as a sum of minimum gate length for the thick and thin gate oxide. Those skilled in the art will appreciate that accurate calculations can be made based on mask tolerances, and the gate length can be minimized by tightening OD2 mask tolerances.

Once the variable thickness gate oxide has been formed, additional standard CMOS processing steps can be employed at step 506 to complete the anti-fuse transistor structure as shown in FIG. 4. This can include formation of the polysilicon gate, LDD regions, sidewall spacers, RPO, and diffusion regions, and salicidation, for example. According to a preferred embodiment of the presently discussed process, a salicidiation step is included to salicide the polysilicon gate and the floating diffusion region of the anti-fuse transistor. An RPO is formed over the diffusion region before hand to protect it from the salicidation process. As previously mentioned, the salicided floating diffusion region will enhance oxide breakdown in the region.

Now an application of the above-described anti-fuse transistor embodiments will be discussed. As mentioned earlier, the compactness of the proposed anti-fuse transistor makes it suitable for memory array applications, and more specifically, OTP memory array applications.

Figure 11A:
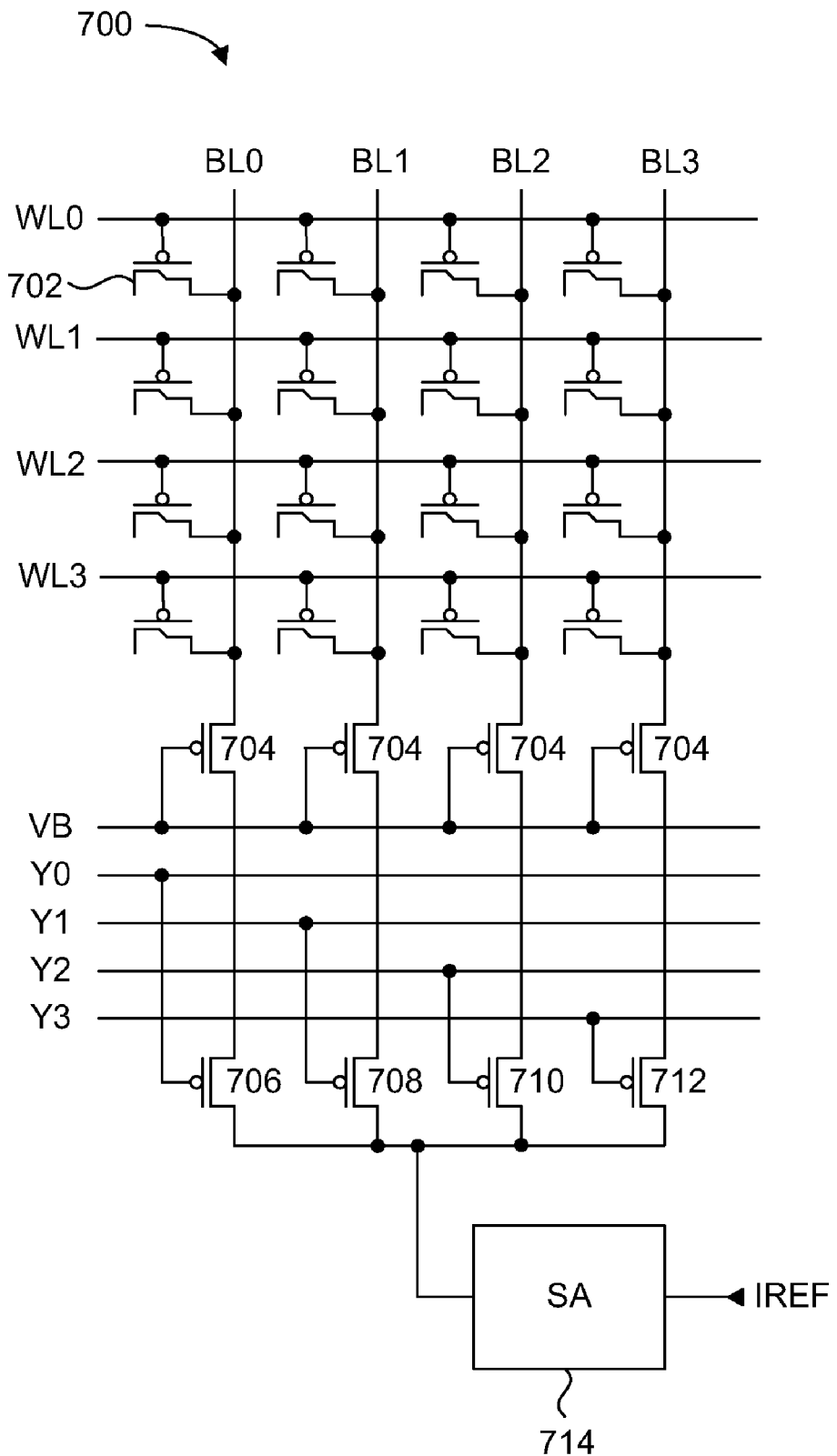
FIG. 11a is a cross-point configured anti-fuse transistor memory array configured for single-ended sensing according to an embodiment of the present invention.

FIG. 11a illustrates a plurality of anti-fuse transistor memory cells arranged in a basic cross-point array, according to an embodiment of the present invention. Sensing is single ended in the present embodiment. The anti-fuse transistor memory array 700 includes anti-fuse transistors 702 coupled to wordlines WL0-WL3 and bitlines BL0, BL1, BL2 and BL3. Anti-fuse transistors 702 can be implemented with any of the previously described anti-fuse transistors. Each bitline is connected to a p-channel isolation transistor 704, which in turn is connected to p-channel pass gates 706, 708, 710 and 712. It is noted that isolation transistors 704 are thick gate oxide transistors, where this thick gate oxide can be the same combination of the intermediate oxide and the thin gate oxide used for the anti-fuse transistor embodiments of the present invention. The gate terminal of all isolation transistors 704 receive isolation voltage VB, while the gate terminals of pass gates 706, 708, 710 and 712 receive column select signals Y0, Y1, Y2 and Y3 respectively. The column select signals perform a one of four bitline selection to couple one of the bitlines to cross-point sense amplifier 714. Cross-point sense amplifier 714 can be a current sense amplifier that compares the current of the bitline to a reference current IREF, and generally denotes single-ended sensing schemes in the present description, where a bitline voltage or current is compared to a reference signal carried on another line.

Figure 12:
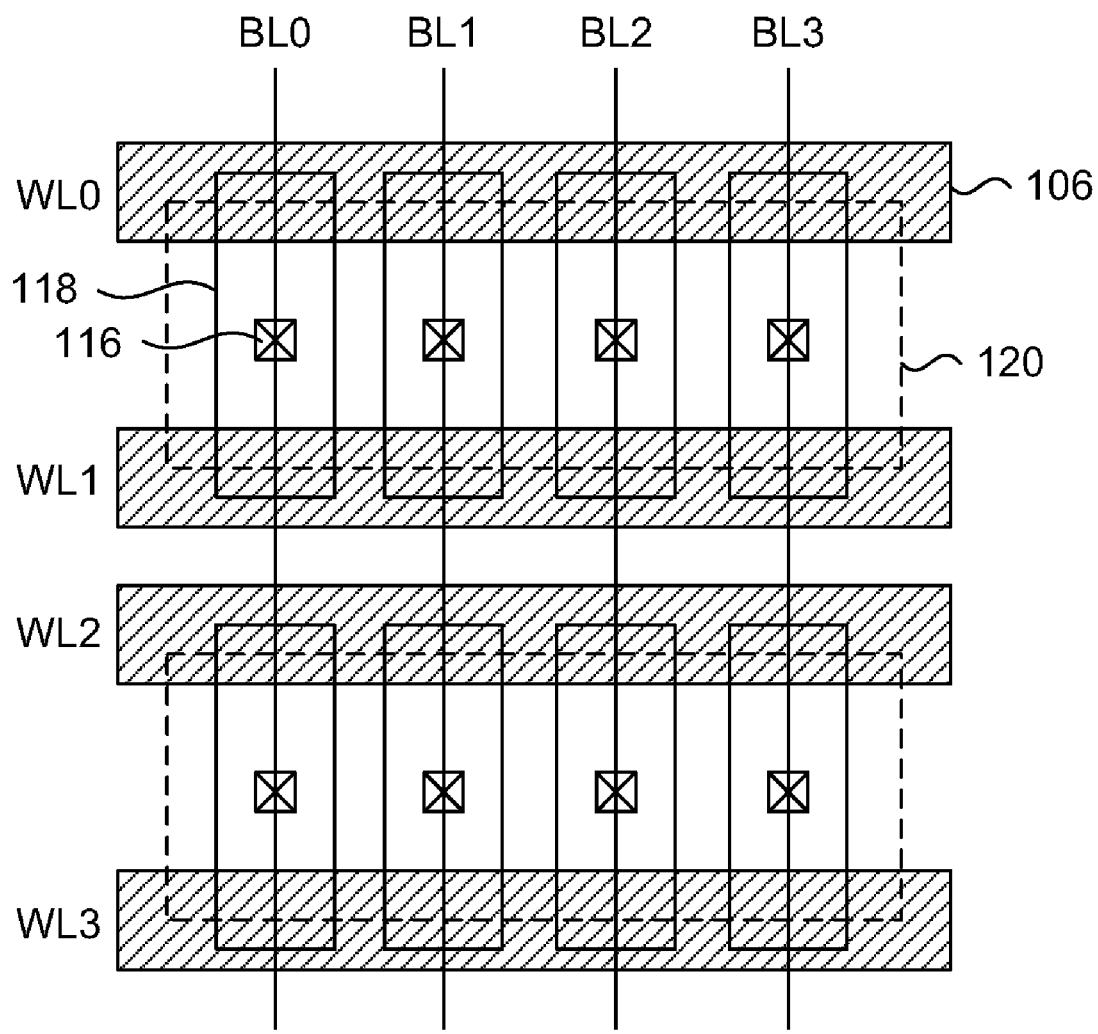
FIG. 12 is a layout of the anti-fuse transistors of the memory array shown in FIG. 11.

FIG. 12 illustrates a layout configuration of four anti-fuse transistors 702 shown in FIG. 11a. Each anti-fuse transistor of FIG. 12 have a layout similar to anti-fuse transistor 100 shown in FIG. 5, except that there is no floating source diffusion region to reduce the overall area of each cell. Accordingly, the same reference numerals are used to denote the same elements in FIG. 12. For the memory array configuration shown in FIG. 12, each bitline contact 116 and active area 118 is shared by two anti-fuse transistors, and the OD2 mask 120 is extended along the wordline direction for all the anti-fuse transistors aligned along the same row.

The anti-fuse transistors are programmed by rupturing the gate oxide, preferably at one of the thin/thick gate oxide boundary and the thin gate oxide/source diffusion edge. This is accomplished by applying a high enough voltage differential between the gate and the channel of the cells to be programmed and a substantially lower voltage differential, if any, on all other cells. Therefore, once a permanent conductive link is formed, a current applied to the polysilicon gate will flow through the link and the channel to the diffusion region, which can be sensed by conventional sense amplifier circuits.

With reference to FIG. 11a, the cell coupled to WL0 and BL0 is programmed by applying a negative voltage −VPP to WL0 and a positive voltage VPOS (or VDD) to BL0, while keeping the other wordlines at VDD and the other bitlines at 0V or another voltage significantly smaller then VPOS. This will expose the cell to be programmed to a voltage differential of V=VPOS+VPP, while all the other cells will be exposed to significantly lower voltage. Note that a positive programming voltage VPOS has to be applied to the cell to be programmed, but once programmed this cell would read as a low state. Either individual cell or multiple cells sharing the same word line can be programmed simultaneously. Although programming circuitry is not shown, those of skill in the art will understand that such circuits can be coupled to the bitlines, and incorporated into the wordline driver circuits.

Once a cell in a row has been programmed, every time the negative voltage is applied to this row for programming another cell, a short between this word line and the bit line of the programmed cell will occur pulling this the bit line towards the negative voltage. According to the present invention, the thick gate oxide isolation transistors 704 are used to isolate the bit lines from the rest of the chip, including the sense amplifiers. These devices can be un-decoded or Y-decoded. Keeping the isolation devices at ground or at the VB level allows the bit lines to float towards a negative voltage, thus having no effect on the programming operation. The voltages used for program (PGM) and read operations are summarized in Table 1 below.

TABLE 1

| | | WL | | |
|---|---|---|---|---|
| | | −VPP | VDD | 0 V or −Vtp |
| BL | VDD or VPOS | PGM | No Access | SOAK |
| | Floating or −VPP | PGM Blocked | No Access | No Access |
| | Precharge to VDD | Soft PGM | No Access | READ |

The un-programmed cells behave like switched capacitors, featuring very low leakage current. In the idle (non-accessed) state, all the word lines WL are kept at VDD, at the same level as the back-bias for the array. All the bit lines BL are also precharged to VDD and therefore, there is no leakage and no current flowing anywhere in the array even if some of the cells were programmed. To execute a read operation with memory array 700, one of the word lines is activated, by driving WL0 to 0V for example, or to another appropriate voltage sufficient for inducing a channel underneath the polysilicon gate. If the cell was not programmed, the bit line will see an increased capacitance and minimally increased leakage. On the other hand, if the cell was programmed, a relatively low resistance (500 Ohm-500 kOhm) within the cell will start discharging the bit line towards ground via the grounded WL0. This difference of behavior can be sensed using a variety of sense amplifier designs known in the art. A simple solution is to use a current sense amplifier, such as well known sense amplifier 714 that is widely used in Flash memories, where the BL current is compared to a reference current. As the anti-fuse ON-resistance can vary significantly from cell to cell, the above-mentioned current sensing scheme requires a very precise current source of about 1 uA. Unfortunately, such small current sensing is slow and susceptible to noise.

One technique to improve the cell current through a programmed anti-fuse is by multiple programming or "soaking" the programmed cell. Cell soaking is widely known and used in non-volatile memory design, either using external programming equipment or an on-chip state machine.

Figure 11B:
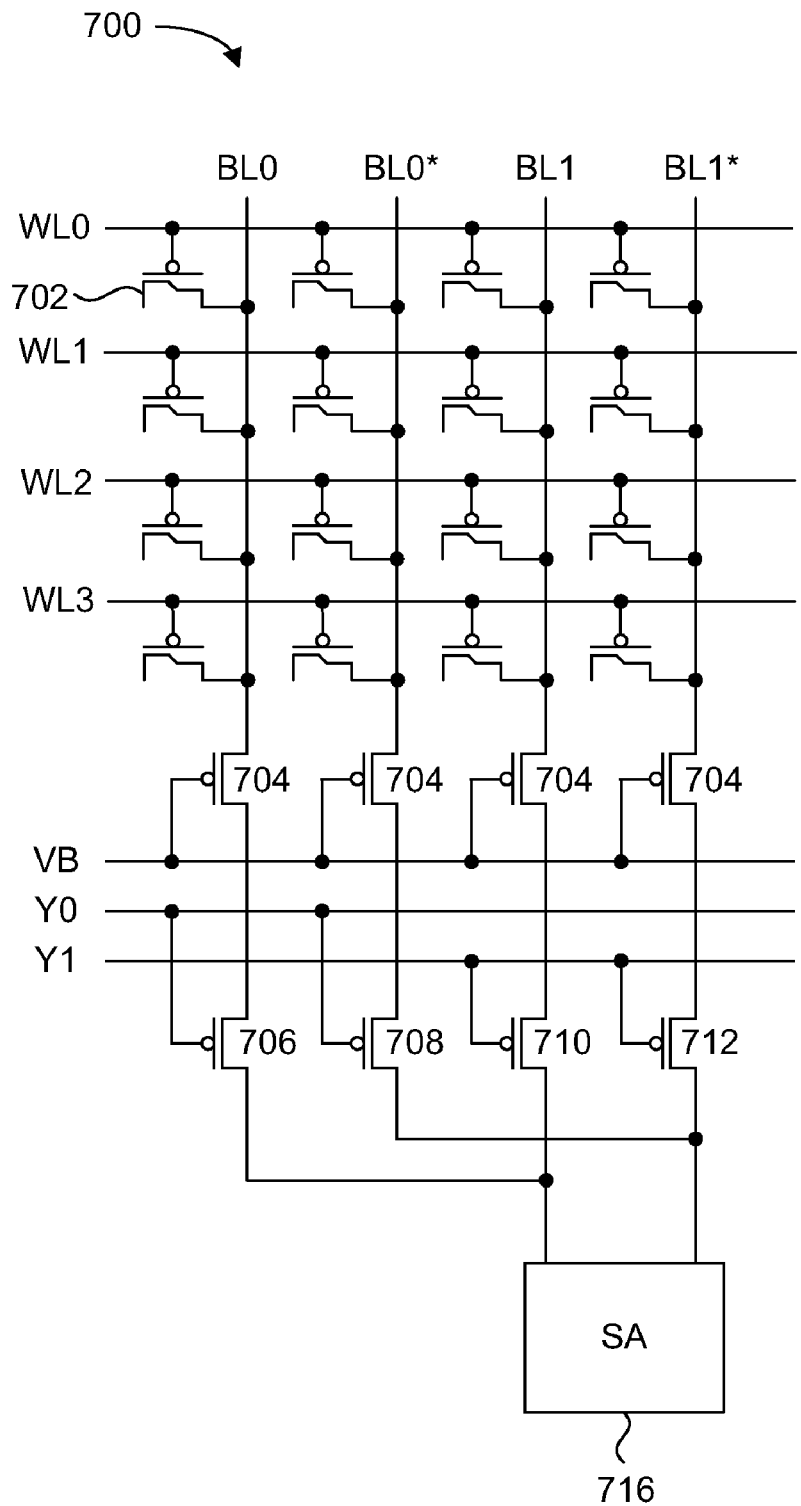
FIG. 11b is a cross-point configured anti-fuse transistor memory array configured for differential sensing according to an embodiment of the present invention.

All these complications can however be avoided by using a differential, or twin cell arrangement, where two memory cells are accessed at the same time with only one cell programmed. Accordingly, data mapping would be required to ensure that each memory cell is paired with a memory cell representing the complementary data. A typical DRAM or SRAM sense amplifier system can be used for such an arrangement. FIG. 11b illustrates another configuration of anti-fuse transistors 702 shown in FIG. 11b arranged in the twin cell configuration. The elements of FIG. 11b are essentially the same as those in FIG. 11a, with the exception of differential sense amplifier 716 which replaces cross-point sense amplifier 714, and the connection of pass gates 706, 708, 710 and 712. Pass gates 706 and 708 now have their gate terminals connected to Y0, while pass gates 710 and 712 have their gate terminals connected to Y1. Therefore, activation of Y0 will turn on both pass gates 706 and 708. The bitlines are now labeled as complementary pairs, BL0/BL0* and BL1/BL1*, where one pair of complementary bitlines is coupled to the differential sense amplifier 716 during a read operation. Those of skill in the art will understand that such a sense amplifier is a type of dual-ended sensing scheme, since either one of the bitlines connected to the differential sense amplifier 716 will typically carry a reference voltage while the other will carry data of the accessed memory cell. In the present example, the reference voltage will be the complement of the data of the memory cell being accessed.

Prior to a read operation, all the bitlines are precharged to VDD. Since the bitlines are all precharged to VDD, one of the bitlines will be pulled toward ground through a programmed cell during a read operation when one wordline is activated. Sensing data from a pair of bitlines carrying VDD and ground becomes straightforward.

Although the simple differential sensing scheme seems well suited for read operations of the programmed array, it poses tremendous test problems because the un-programmed memory array yields random and unstable data. In addition, such differential cell arrangement does not provide means for margin adjustment necessary for program verify operation. These and other drawbacks of the above described sensing architectures can be mitigated by employing a folded bitline architecture with a dual ended sensing scheme, as shown in a preferred embodiment in FIG. 13.

Figure 13:
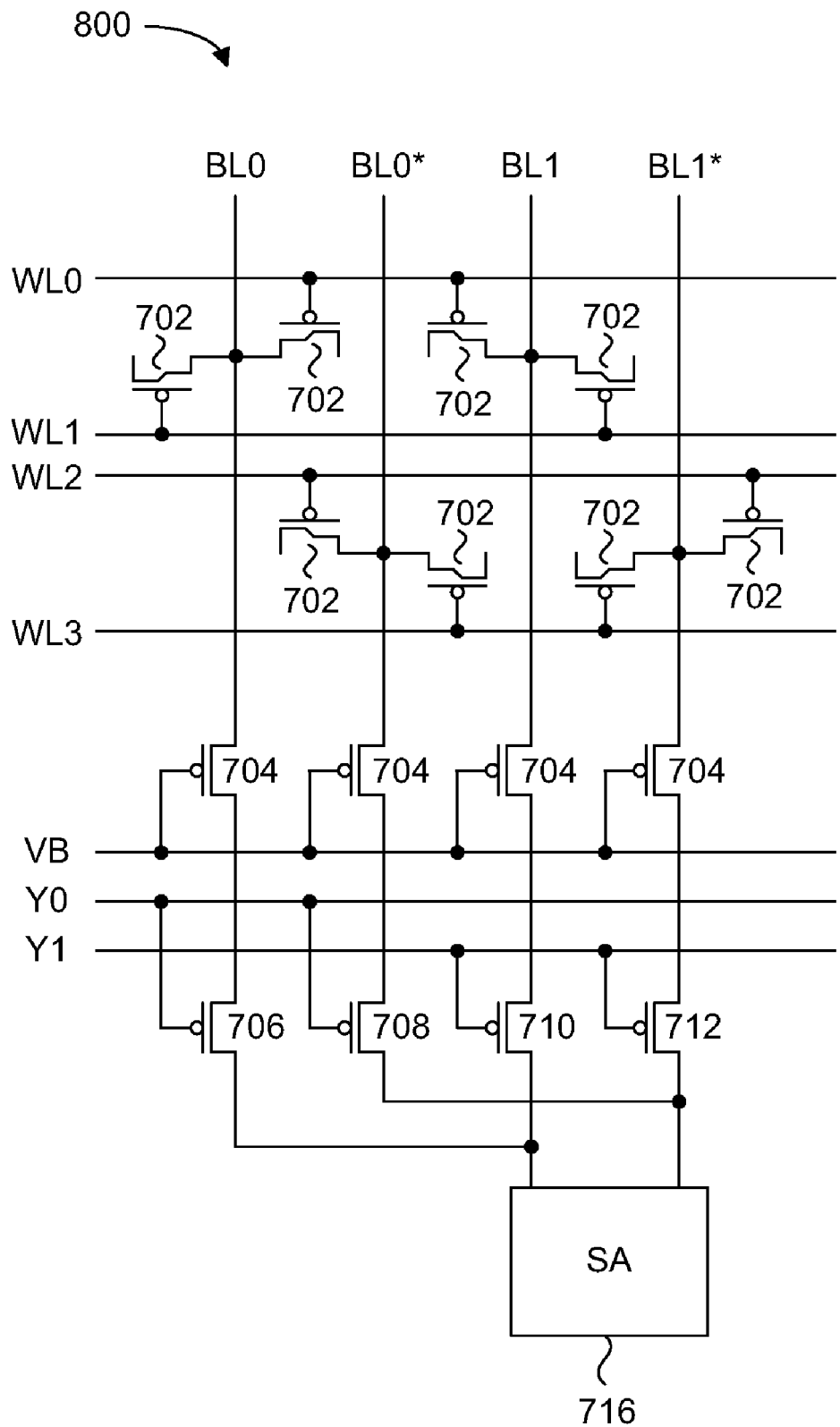
FIG. 13 is a folded bitline configured anti-fuse transistor memory array according to an embodiment of the present invention.

FIG. 13 shows a folded bitline architecture employing the previously described anti-fuse transistors 702. Memory array 800 is similar to memory array 700 of FIG. 11b, except that memory cells 702 are arranged in the folded bitline architecture.

The following is an example of a read operation of programmed data in memory array 800. It is assumed that the two anti-fuse transistors 702 located between BL0 and BL0* are used to store one bit of data, where the cell connected to WL0 is not programmed, while the cell connected to WL2 is programmed. To read these two transistor cells, WL0 and WL2 are driven to ground. Since the top cell is not programmed, BL0 will remain at the precharge level of VDD. However, since the bottom cell is programmed, BL0* will discharge towards ground through the cell. Note that the top and bottom anti-fuse transistor cells between BL1 and BL1* are also accessed. However, these bitlines are isolated from the sense amplifier since only Y0 would be driven to ground to activate pass transistors 706 and 708 and couple BL0/BL0* to folded bitline sense amplifier 716. Those of skill in the art will understand that the column select signals Y0 and Y1 can be activated at a predetermined time after the wordlines are driven, to give the bitlines time to discharge to a sufficiently low voltage level, preferably to ground to provide the largest sensing margin.

Figure 14:
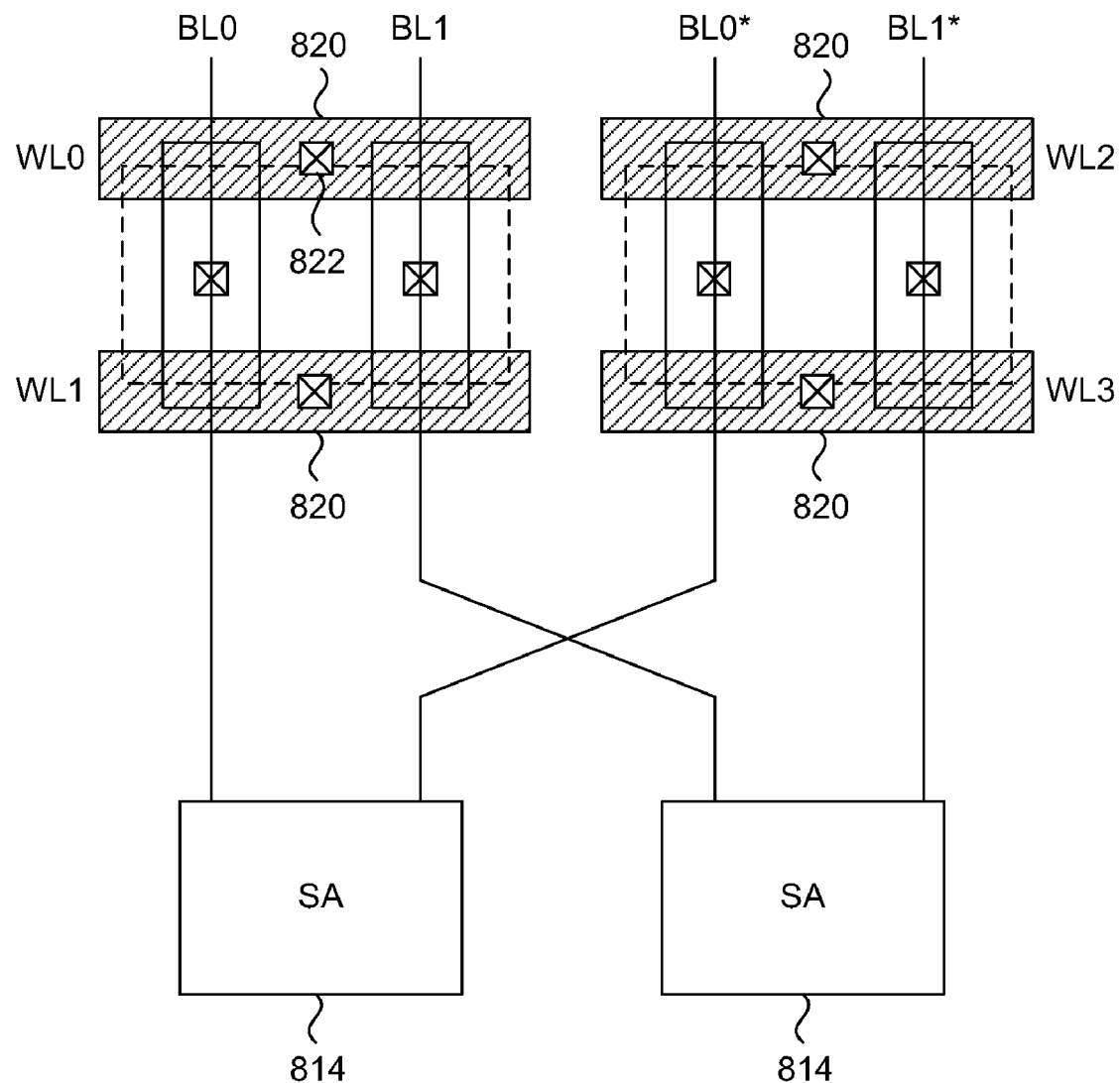
FIG. 14 is a layout of anti-fuse transistors employing wordline segments according to an embodiment of the present invention.

FIG. 14 illustrates an alternate differential cell arrangement according to another embodiment of the present invention. The anti-fuse transistor cells shown are identical to those shown in FIG. 12, but are now arranged such that the polysilicon wordlines are broken into segments 820, where each segment 820 is coupled to two different anti-fuse transistor cells. Alternatively, the anti-fuse transistor pair shown in FIG. 8 can be used here as well. The segments can be connected to metal wordlines through wordline contact 822 via intermediate metal lines as required. It is well known in the art that the combination of metal wordlines connected to polysilicon wordline segments improves overall performance of the memory array. The particular arrangement shown in FIG. 14 enables single-ended sensing or dual-ended sensing of the bitlines by configuring the wordline decoders. In other words, the wordline drivers can be controlled dynamically to drive only one wordline or two wordlines simultaneously in similar fashion to the DRAM decoder shown in issued U.S. Pat. No. 6,549,483. In the current application however, the single ended mode is used for a non-volatile memory cell test, and program and verify operations, whereas the dual ended mode is used for normal read operations only. Such a combination allows for independent sensing optimization for read, test and verify, resulting in greatly improved read margins. The details of the single ended sensing mode will be described later.

Figure 15:
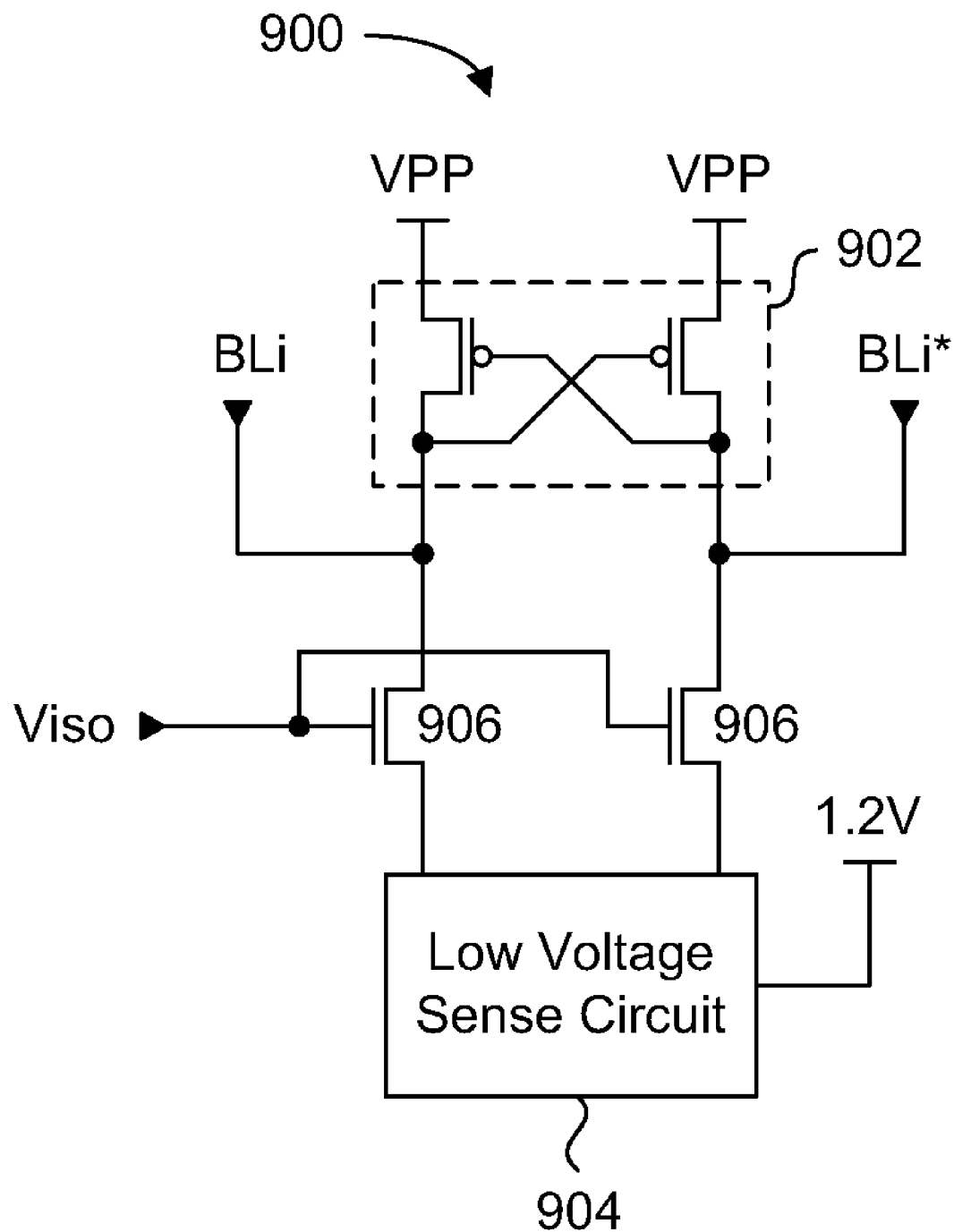
FIG. 15 is a circuit diagram of a combined sense and programming circuit according to an embodiment of the present invention.

According to an embodiment of the present invention, programming circuits can be incorporated with the sensing circuit of the differential sense amplifier circuit. FIG. 15 is a circuit diagram of an embodiment of such a circuit for n-type antifuse. Sense/program circuit 900 includes a high voltage cross-coupled p-type latch circuit 902 and a low voltage sense circuit 904 separated by thick gate oxide isolation transistors 906 controlled by Viso. Viso is preferably a variable voltage signal, such that Viso can be less than VDD for data verification after programming to limit current draw. The cross-coupled latch circuit 902 receives VPP or another program blocking voltage, and each branch of the latch circuit 902 is connected to a complementary pair of bitlines BLi/BLi*, while the sense circuit 904 receives a 1.2V supply voltage. Viso is preferably set to a maximum voltage level of about VDD+Vt=1.8V to isolate the more sensitive sense circuit transistors from the VPP voltage.

In a programming operation, sense circuit 904 receives write data, which is coupled to latch circuit 902 via activated isolation transistors 906. Latch circuit 902 effectively performs a level shift of the 1.2V data to VPP, which is then driven onto the appropriate bitline. Furthermore, during read operation the back bias connection is preferably maintained at a high voltage, while the supply voltage is kept at or below VDD to turn off the high voltage PMOS transistors at all times.

As previously described, the folded bitline architecture shown in FIG. 13 uses a bitline sense amplifier 716 for sensing a voltage differential on the complementary bitlines BL0/BL0* or BL1/BL1*. According to an embodiment of the present invention, bitline sense amplifier 716 can be implemented with a standard DRAM CMOS cross-coupled inverter circuit, which is well known in the DRAM field. With the appropriate timing control and associated bitline sensing circuits, high speed sensing of the described anti-fuse memory cells arranged in a complementary bitline scheme, such as the folded bitline architecture, can be achieved.

Figure 16:
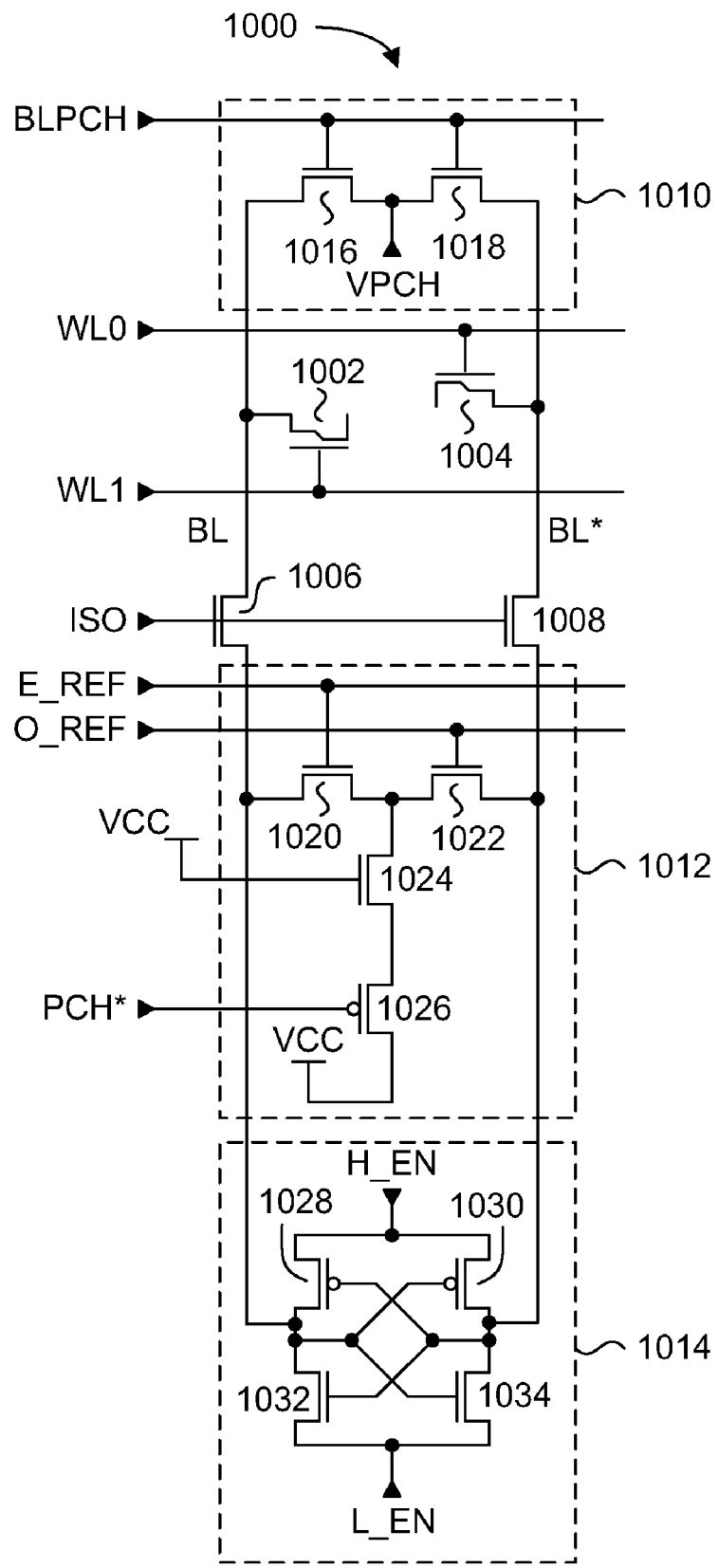
FIG. 16 is a circuit schematic of a folded bitline anti-fuse memory array, according to an embodiment of the present invention.

FIG. 16 is a schematic of a portion of a folded bitline anti-fuse memory array, similar to that shown in FIG. 13. In order to simplify the schematic, only one folded bitline pair BL/BL*, its associated bitline sensing circuitry, and two wordlines are shown. Folded bitline anti-fuse memory array 1000 includes wordlines WL0 and WL1 connected to the gate terminals of n-channel anti-fuse transistors 1002 and 1004, n-channel isolation transistors 1006 and 1008 for coupling the upper portion of the bitlines to the lower portion of the bitlines in response to signal ISO, and bitline sensing circuitry. The bitline sensing circuitry includes a precharge circuit 1010, a reference charge circuit 1012, and a bitline sense amplifier 1014.

The precharge circuit 1010 includes two n-channel precharge transistors 1016 and 1018 connected in series between BL and BL* and having their gate terminals connected to precharge signal BLPCH. The shared source/drain terminal of precharge transistors 1016 and 1018 receives a precharge voltage VPCH. In operation, both precharge transistors 1016 and 1018 will turn on to precharge bitlines BL and BL* to VPCH in response to an active high logic level of BLPCH, in preparation for a read operation.

The reference charge circuit 1012 includes n-channel steering transistors 1020 and 1022 connected in series between BL and BL*, a capacitance circuit implemented as an n-channel transistor 1024, and a p-channel precharge transistor 1026. Steering transistor 1020 has its gate terminal connected to even selection signal E_REF, while steering transistor 1022 has its gate terminal connected to odd selection signal O_REF. Capacitance circuit 1024 has its gate terminal connected to voltage supply VCC, and is connected in series with precharge transistor 1026 between the shared source/drain terminal of steering transistors 1020 and 1022 and voltage supply VCC. Precharge transistor 1026 has its gate terminal connected to precharge signal PCH*. Generally, capacitance circuit 1024 will be precharged when a low logic level PCH* pulse is received. The duration of the PCH* pulse can be predetermined based on the size of transistor 1024 and the desired reference charge to be provided. Once precharged, either steering transistor 1020 or 1022 is turned on to couple the reference charge of capacitance circuit 1024 to the corresponding bitline. By example, the charge being added to a bitline can be approximately 50 millivolts. It is noted that signals E_REF and O_REF can be controlled by the same even/odd addressing bit used for selecting WL0 or WL1. In one embodiment, activation of WL0 will cause E_REF to be activated, thereby coupling the reference charge to the complementary bitline.

The bitline sense amplifier 1014 consists of a standard cross-coupled inverter circuit that is well known in the art. The circuit includes p-channel transistors 1028 and 1030, both connected in series to respective n-channel transistors 1032 and 1034. The common drain terminal of p-channel transistors 1028 and 1030 receives a high logic level enable signal H_EN, while the common source terminal of n-channel transistors 1032 and 1034 receives a low logic level enable signal L_EN. H_EN can be a lowered internal VCC level, while L_EN can be a VSS level. The operation of bitline sense amplifier 1014 in the DRAM art is well known. When enable signals H_EN and L_EN are activated, either at the same time or at different times, bitline sense amplifier 1014 will sense a small voltage differential between BL and BL*, and quickly drive both BL and BL* to the full logic level states of H_EN and L_EN.

It is noted that the memory array of FIG. 16 is inverted relative to the embodiment shown in FIG. 13. More specifically, the memory array of FIG. 13 uses p-channel anti-fuse memory cells while the memory array of FIG. 16 uses n-channel anti-fuse memory cells. Accordingly, the values shown in Table 1 for operating the memory array of FIG. 13 should be inverted for the memory of FIG. 16.

The memory array shown in FIG. 16 can be operated in one of two different modes. The first mode is a standard single cell/bit mode, while a second mode is a two cell/bit mode. In the two cell/bit mode, one memory cell connected to one bitline of the folded bitline pair and a second memory cell connected to the other bitline of the folded bitline pair are both accessed at the same time by driving their respective wordlines at the same time. In each of the two different operating modes, a redundancy mode can be used. In the single cell/bit redundancy mode, two wordlines corresponding to two memory cells connected to the same bitline are activated during a read operation. In the two cell/bit redundancy mode, two wordlines corresponding to two memory cells connected to the same bitline and two wordlines corresponding to two memory cells connected to the other bitline are activated during a read operation. The redundancy mode increases the reliability of the memory array by activating two memory cells connected to the same wordline for reading one bit of data. Those skilled in the art will understand that wordline decoding logic can be implemented to enable activation of the necessary wordlines. Further details of the single cell/bit and two cell/bit operation will follow.

The high speed sensing scheme of the present embodiment is possible due to the nature of the previously described anti-fuse structure. The programmed anti-fuse memory cell of the present embodiments will behave like a resistive element, and in the presently shown configuration, will add charge to a bitline through its corresponding wordline.

The general high speed sensing scheme for a single cell/bit mode of operation according to an embodiment of the present invention is as follows. It is assumed that ISO is at the high logic level to turn on isolation transistors 1006 and 1008, and that capacitance circuit 1024 has been precharged. First, both BL/BL* are precharged to a first voltage supply level provided by VPCH, such as VSS, by activating BLPCH and turning on transistors 1016 and 1018. Then one wordline, such as WL0, is driven to a second supply voltage level preferably opposite to the first voltage supply level, such as VCC for example. WL0 is connected to anti-fuse memory cell 1004, which has its drain terminal connected to BL*. Occurring substantially at the same time as WL0 is driven, E_REF is driven to the high logic level to turn on steering transistor 1020 and couple the capacitance circuit 1024 to bitline BL. Now a reference charge will be present on bitline BL, which will raise the voltage of BL by about 50 millivolts for example. Enable signals H_EN and L_EN can then be driven to high and low voltage levels respectively for enabling bitline sense amplifier 1014.

If memory cell 1004 has been programmed and conducts (a blown state of anti-fuse), then wordline WL0 will raise the voltage level of BL* from the precharge voltage of VSS towards VCC through the conduction path of the memory cell. Preferably, the voltage of BL* will be 100 millivolts, which is higher than the reference voltage of BL, when the bitline sense amplifier 1014 is activated. This voltage differential is quickly detected, amplified and latched by bitline sense amplifier 1014. On the other hand, if memory cell 1004 has not been programmed, then BL* will remain at the precharge voltage of VSS, which is less than the reference voltage of BL. In this case, the bitline sense amplifier 1014 will latch the opposite state.

The high speed sensing scheme for a two cell/bit mode of operation according to an embodiment of the present invention is as follows. It is assumed that ISO is at the high logic level to turn on isolation transistors 1006 and 1008. Reference charge circuit 1012 can be disabled for the two cell/bit mode of operation as a reference charge is not required. First, both BL/BL* are precharged to a first voltage supply level provided by VPCH, such as VSS, by activating BLPCH and turning on transistors 1016 and 1018. Then a pair of wordlines, such as WL0 and WL1, are driven to a second supply voltage level preferably opposite to the first voltage supply level, such as VCC for example. WL0 is connected to anti-fuse memory cell 1004, which has its drain terminal connected to BL* and WL1 is connected to anti-fuse memory cell 1002, which has its drain terminal connected to BL. In the two cell/bit mode, one of memory cells 1002 and 1004 will always be programmed and the other will not be programmed. Therefore, one bitline will always remain at VSS while the other rises to about 100 millivolts. Enable signals H_EN and L_EN can be driven to high and low voltage levels respectively for enabling bitline sense amplifier 1014.

A detailed high speed sensing operation of the folded bitline anti-fuse memory array of FIG. 16 according to an embodiment of the present invention will now be described with reference to the flow chart of FIG. 17a and the timing diagram of FIG. 17b. FIG. 17b shows signal traces for the control signals used in the bitline sensing circuitry of FIG. 16, and of the wordline and bitline voltages. The presently described method is directed to a single cell/bit bit mode of operation.

It is presumed that signal ISO remains at the high voltage level for the read operation, and that memory cell 1004 connected to WL0 is a programmed memory cell. The method starts at step 1100, where the capacitance circuit 1024 is precharged when PCH* is pulsed for a predetermined duration of time. Following at step 1102, the bitlines are precharged to the first voltage supply level, such as VSS in the present example, by pulsing BLPCH to the high logic level for a predetermined duration of time. In the present example, the BLPCH and PCH* pulses are concurrent, but can occur at any time relative to each other but before a wordline is activated. Based on the decoded row address, the desired wordline is driven to the second voltage supply level at step 1104. WL0 will be driven to VCC in the present example. Occurring at substantially the same time, but noted as step 1106, E_REF is driven to VCC to turn on steering transistor 1020. Although not shown in FIG. 17b, O_REF remains at VSS.

Because memory cell 1004 is programmed, the VCC biased wordline will charge up BL* through its conductive channel. E_REF turns on steering transistor 1020 to add the reference charge to BL. Steering transistor 1020 is kept on for a predetermined period of time, and then shut off by driving E_REF to VSS at step 1108. Shortly afterwards at step 1110, H_EN is driven to the high logic level and L_EN is driven to the low logic level to activate bitline sense amplifier 1014. The differential between BL and BL* is sensed and fully latched by the bitline sense amplifier 1014. The ISO signal is driven to the low logic state to turn off isolation transistors 1006 and 1008 during sensing, to decrease the load on the bitline sense amplifier 1014. This also allows the wordline to be turned off in order to accelerate bitline precharge for the next read cycle.

In FIG. 16, a memory cell is connected to one bitline while either steering transistor 1020 or 1022 is connected to the other bitline, acting as a reference bitline. The bitline from which data is to be sensed from a connected memory cell can be called a data bitline. Unfortunately, there can be a capacitance imbalance seen by one bitline versus the other, since the electrical characteristics of a memory cell will be different than that of steering transistors 1020 and 1022. Therefore, to ensure that the bitlines are better balanced during a sensing operation, dummy memory cells can be used instead of the steering transistors 1020 and 1022, according to an embodiment of the present invention. More specifically, dummy memory cells are identical to "normal" memory cells in the memory array. By using dummy memory cells for delivering the reference voltage, the bitline to wordline coupling becomes virtually identical on both the reference bitline and the data bitline.

Figure 18:
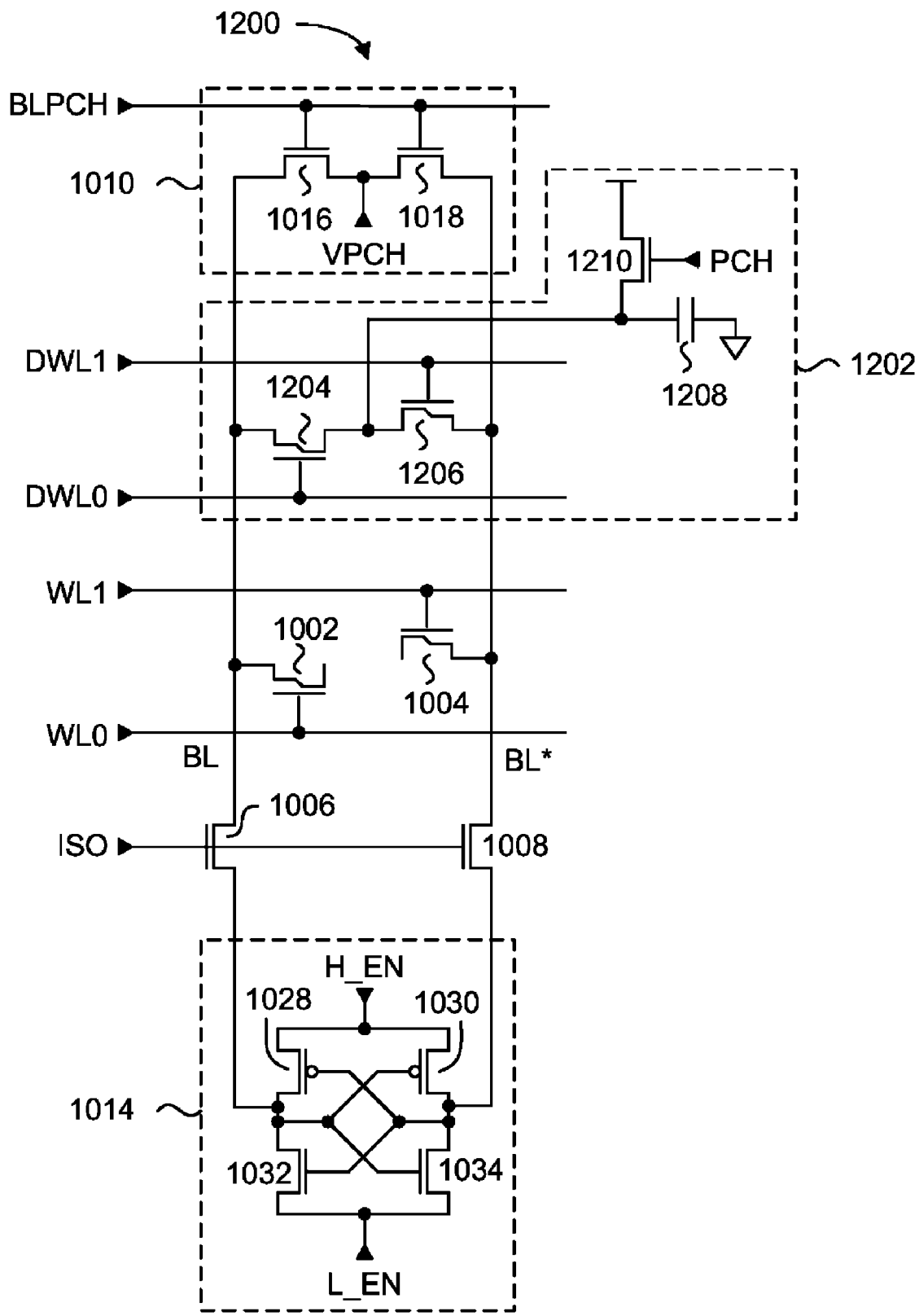
FIG. 18 is a circuit schematic of a folded bitline anti-fuse memory array having an alternate reference charge circuit, according to embodiment of the present invention.

FIG. 18 is a schematic of an alternate folded bitline anti-fuse memory array according to another embodiment of the present invention. The alternate folded bitline anti-fuse memory array shown in FIG. 18 is similar to that shown in FIG. 16, but employs an alternate reference charge circuit that uses dummy memory cells. Folded bitline anti-fuse memory array 1200 includes the same numbered elements as previously shown and described in FIG. 16, and hence no further description of these elements is required. Reference charge circuit 1202 includes dummy memory cells 1204 and 1206, each having a gate terminal connected to dummy wordline DWL0 and DWL1 respectively.

It is noted that while normal anti-fuse memory cells have only one source diffusion region, dummy memory cells 1204 and 1206 have an additional drain diffusion region for receiving the reference voltage. Dummy memory cells 1204 and 1206 are not programmed, but a dummy cell will form a conductive channel between its source and drain terminals when a positive gate voltage is applied. The common terminal of dummy memory cells 1204 and 1206 is connected to a capacitance means 1208 and a precharge transistor 1210. N-channel precharge transistor 1210 has a gate terminal connected to precharge signal PCH. It is noted that the configuration of capacitance means 1208 and n-channel precharge transistor 1210 functions equivalently to capacitance circuit 1024 and p-channel precharge transistor 1026, except that capacitance means 1208 is precharged when PCH pulses to the high logic level to turn on precharge transistor 1210.

In the presently shown embodiment, reference charge circuit 1202 is connected to the upper bitlines, whereas the reference charge circuit 1012 of FIG. 16 was connected to the lower bitlines. In a further embodiment, the reference charge circuit 1012 of FIG. 16 can be modified to replace the n-channel steering transistors 1020 and 1022 with dummy memory cells. As previously discussed, the n-channel isolation transistors 1006 and 1008 effectively divide the bitlines into an upper portion and a lower portion, where the upper portion is a high voltage domain and the lower portion is a low voltage domain. Because signal ISO is limited to a predetermined low supply voltage, any high voltages appearing on the upper portion of the bitlines during programming operations will be blocked from the more sensitive low voltage bitline sense amplifier circuitry connected to the lower portion. Accordingly, those skilled in the art will understand that the transistors of the high voltage domain can have gate oxide thicknesses that are greater than those transistors in the low voltage domain.

In the previously described embodiments, PCH* is first pulsed for a predetermined duration of time, and the steering transistors 1020 and 1022 are turned on then off before the bitline sense amplifier 1014 is activated. According to an embodiment of the present invention, the timing of the precharge signal PCH* and the signals E_REF and O_REF, can be controlled to adjust the amount of charge being added to the bitline acting as a reference bitline. Hence the reference level of the reference bitline can be adjusted.

Figure 19A:
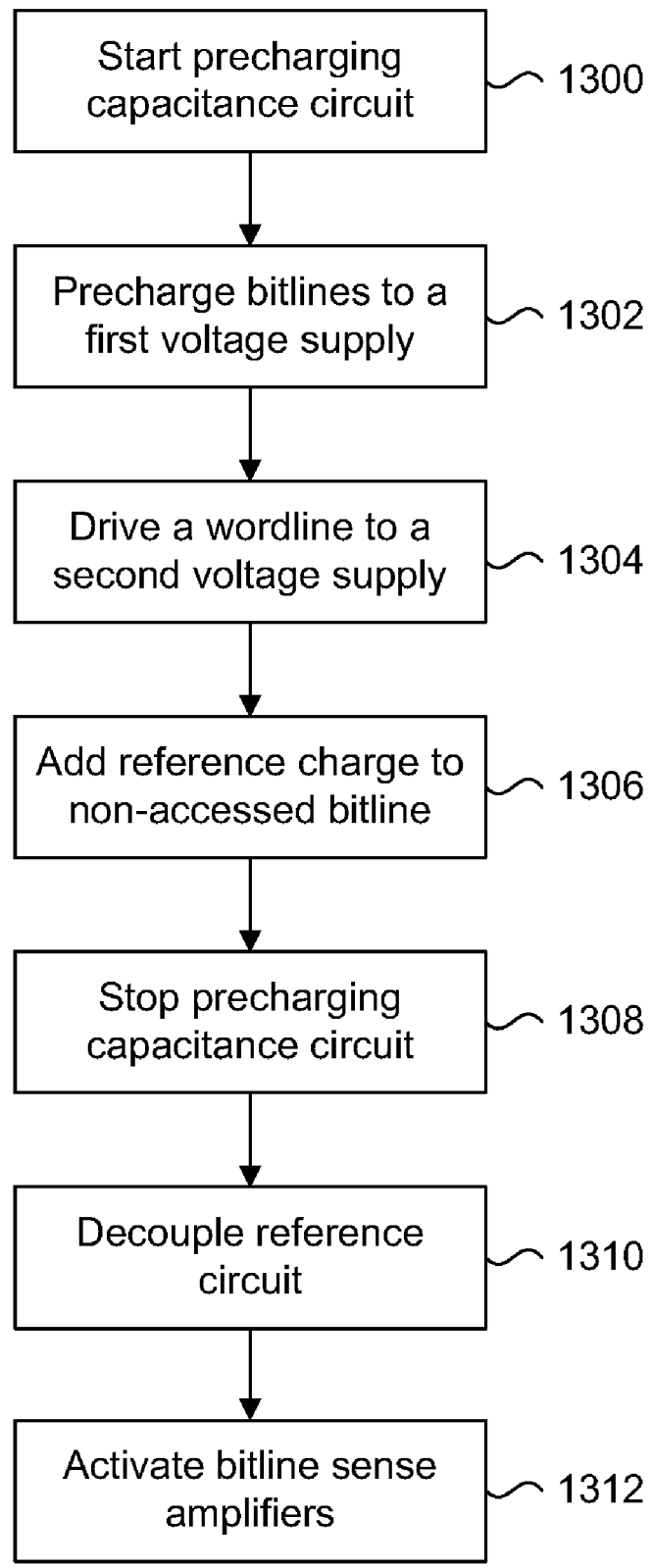
FIG. 19a is a flow chart showing an alternate method for sensing data using the folded bitline anti-fuse memory array of FIG. 16 or 18, according to an embodiment of the present invention.
Figure 19B:
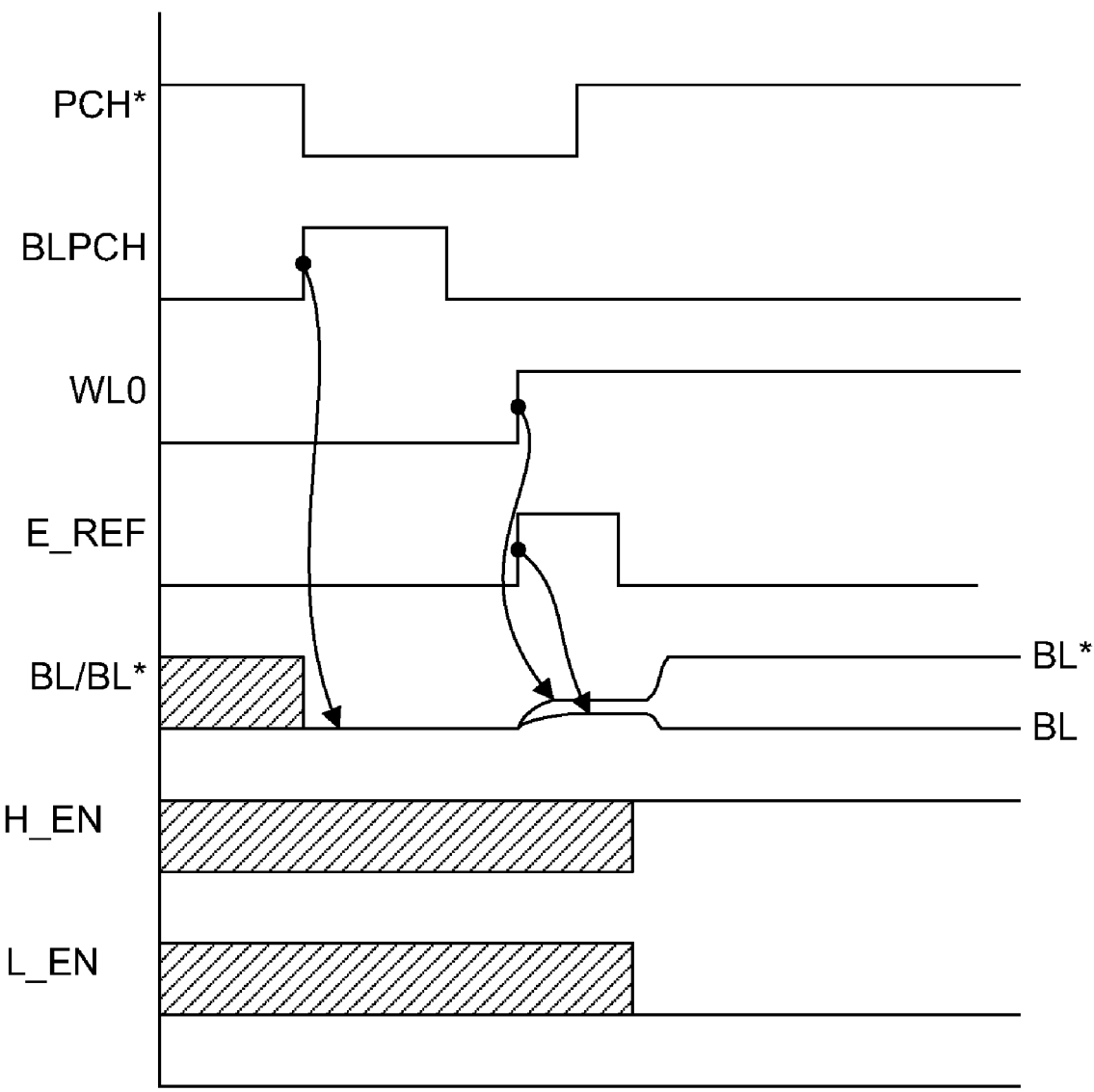

FIG. 19a is a flow chart illustrating an alternate sensing method using the folded bitline anti-fuse memory array of FIG. 16, while FIG. 19b is a corresponding timing diagram showing the traces of the control signals used in the folded bitline anti-fuse memory array 1000. The method starts at step 1300, where precharging of the capacitance circuit 1024 begins. This corresponds to PCH* falling to a low logic level. Then at step 1302, the bitlines are precharged to a first voltage supply, such as VSS for example. A selected wordline, such as WL0, is driven to a second voltage supply, such as VCC for example, at step 1304. Memory cell 1004 will then couple the WL0 voltage to BL* if it is programmed. At step 1306, the reference charge provided by capacitive circuit 1024 is coupled to BL. More specifically, signal E_REF is driven to the high logic level to turn on steering transistor 1020. It is noted that PCH* is still at the low logic level, therefore more charge than the method of FIG. 17a can be added to BL. At step 1308, PCH* is raised to the high logic level to turn off precharge transistor 1026. Following at step 1310, E_REF is driven to the low logic level to turn off steering transistor 1020. At step 1312, the bitline sense amplifier 1014 is activated and the differential between BL and BL* is sensed.

Figure 17A:
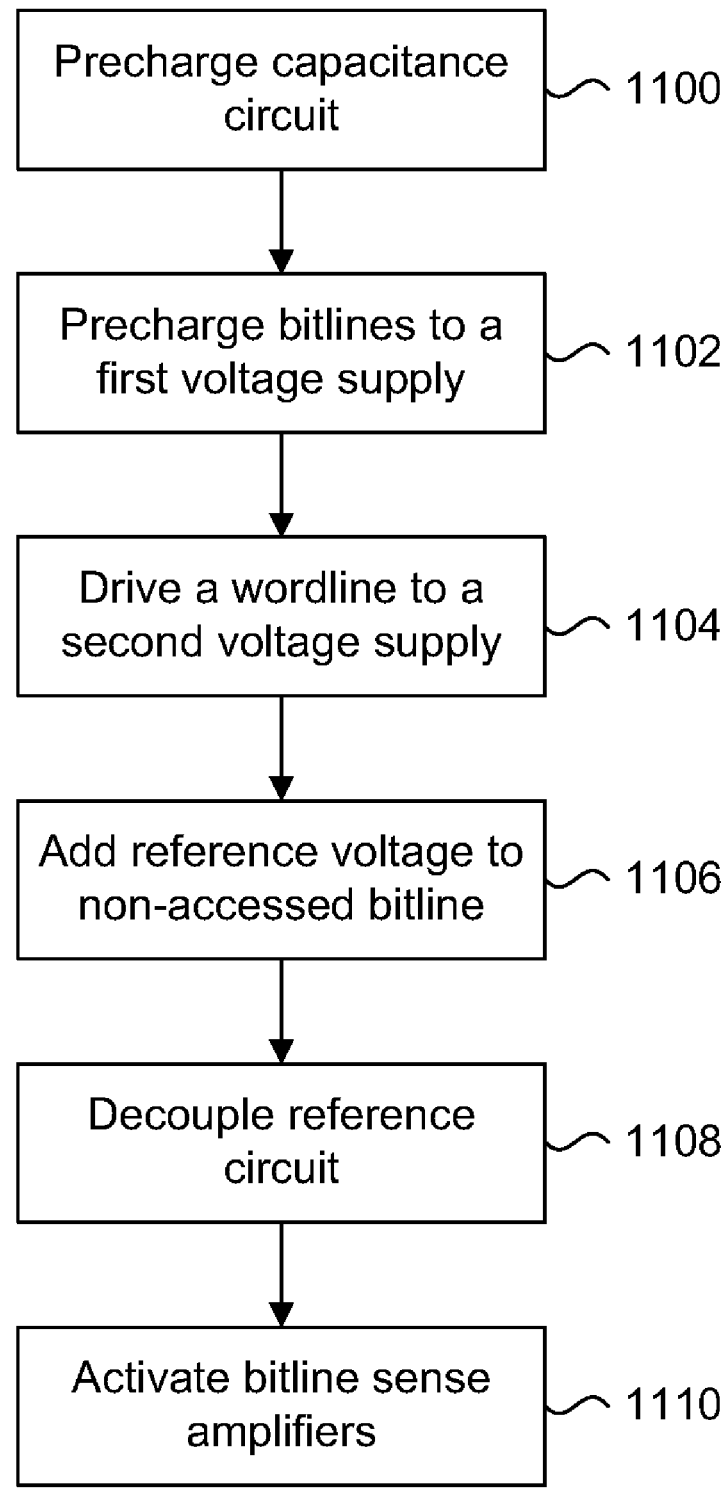
FIG. 17a is a flow chart showing a method for sensing data using the folded bitline anti-fuse memory array of FIG. 16, according to an embodiment of the present invention.
Figure 17B:
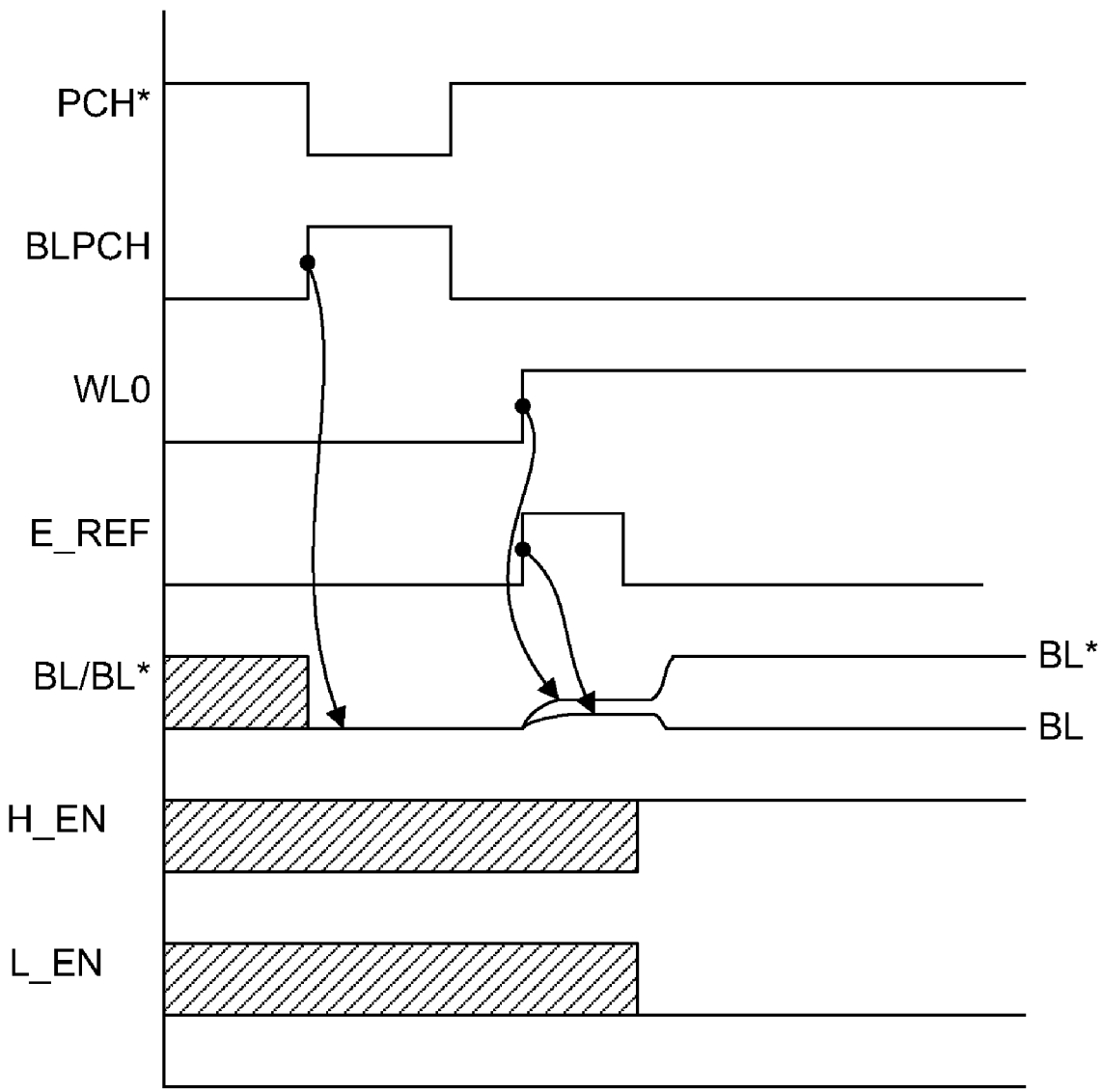

The sensing method shown in FIG. 19a is similar to the sensing method shown in FIG. 17a, except that PCH* remains active to keep precharge transistor 1026 turned on while steering transistor 1020 is turned on. FIG. 19 is one example of the timing control over E_REF and PCH* for adjusting the reference charge to be provided. Those skilled in the art will understand that the PCH* pulse duration and the E_REF signal deactivation time can be tailored to achieve the desired reference charge on the un-accessed bitline. The timing can be controlled externally in a test mode, or internally with well known logic circuitry. This adjustability allows for several advantageous applications.

By adjusting the reference charge level on the reference bitline, the relative conductive capability of a programmed anti-fuse memory cell can be tested. Hence convenient cell margining operations can be executed since the timing of PCH* and E_REF (or O_REF) can be calibrated to expected or experimental reference charges applied to the reference bitline. The method of FIG. 19a can be used for program verify operations, to ensure that the programmed cells have a sufficient conducting current. In a two-cell per bit mode of operation, reference voltages, and hence the reference charge circuits, are not used. However, in a test mode, a reference charge can be progressively increased on one bitline while a programmed memory cell connected to the complementary bitline conducts. Eventually, the bitline sense amplifier will flip its state, which reveals the voltage applied to the bitline by the programmed memory cell.

The embodiment of the invention shown in FIGS. 16 and 18 can sense the difference in voltage between a pair of folded bitlines, in order to sense the programmed or unprogrammed state of an anti-fuse memory cell. Furthermore, timing of the reference charge circuit 1012 can be adjusted to change the reference charge being added to the reference bitline. This can be done for testing operations, as previously described, or to ensure that the optimal reference voltage level is provided to improve sensing margins of programmed anti-fuse memory cells. Those skilled in the art will understand that process variations can change the current conducting level of programmed anti-fuse memory cells, therefore, having the ability to adjust the reference voltage after the memory array is programmed will ensure reliable operation.

Figure 20:
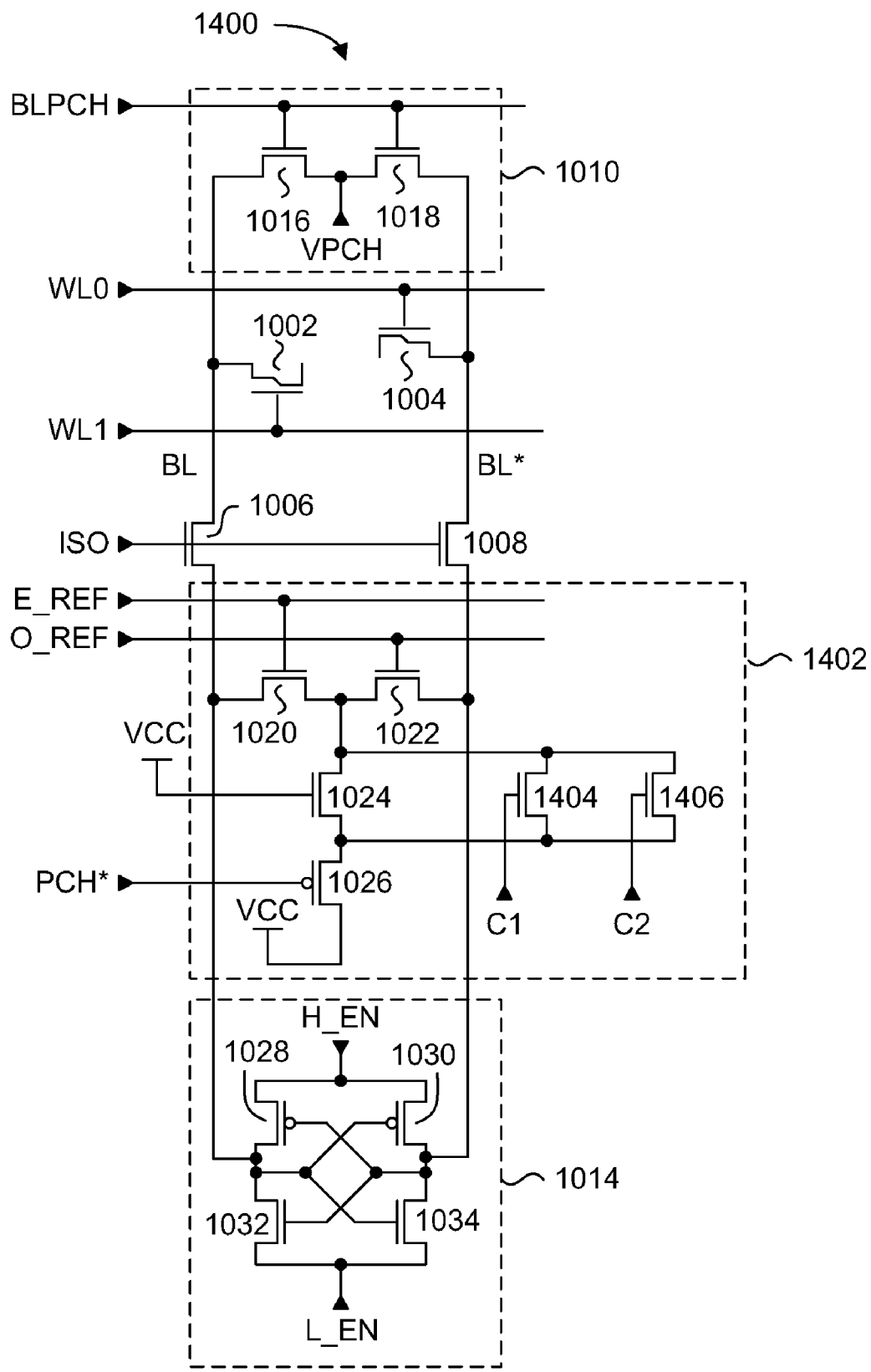
FIG. 20 is a circuit schematic of a folded bitline anti-fuse memory array having a selectable reference charge circuit, according to embodiment of the present invention.

Another technique for adjusting the charge being added to an reference bitline without having to adjust timing of control signals is to selectively add more capacitance to the reference bitline. FIG. 20 is a schematic of an alternate folded bitline anti-fuse memory array according to another embodiment of the present invention. The alternate folded bitline anti-fuse memory array shown in FIG. 20 is similar to that shown in FIG. 16, but employs an alternate reference charge circuit that can increase the amount of charge to be added to an reference bitline.

Folded bitline anti-fuse memory array 1400 includes the same numbered elements as previously shown and described in FIG. 16, and hence no further description of these elements is required. Reference charge circuit 1402 includes supplemental capacitance circuits 1404 and 1406, each having a gate terminal connected to a selection signal C1 and C2, respectively. The supplemental capacitance circuits are shown in the present embodiments as n-channel transistors connected in parallel to primary capacitance circuit 1024, but p-channel transistors can be used with equal effectiveness. To supplement the charge provided by primary capacitance circuit 1024, one or both of capacitance circuits 1404 and 1406 can be activated by driving C1 and C2 to the high logic level. Transistors 1404 and 1406 can be identically sized as transistor 1024, or each can be sized differently. Furthermore, any number of additional capacitance circuits can be included, and any combination of supplemental capacitance circuits can be activated, to provide more flexibility and finer control over the reference charge to be added to the reference bitline. The sensing operation can be the same as previously described for FIG. 17a.

While the embodiments for adjusting the reference charge by signal timing control and supplemental capacitance addition have been described exclusively of each other, the two techniques can be used in combination to obtain the highest amount of flexibility. For example, any number of supplemental capacitance circuits can be activated and precharged while the steering signal E_REF or O_REF are activated, as per the sensing method previously described for FIG. 19a.

In the previously described embodiments of the high-speed sensing scheme, a reference charge was added to one bitline acting as a reference bitline of the folded bitline pair. Controlled timing of the reference charge circuit and/or selective addition of supplemental capacitance can be used for providing a reference charge. At high clock speeds however, it may not be practical or possible to generate the necessary timing for proper operation. Therefore, a high speed self-sensing scheme for the differential bitline anti-fuse memory array, according to an embodiment of the present invention, is proposed.

In the high-speed self-sensing scheme according to the present embodiment, an additional capacitance can be added to the data bitline of the complementary bitline pair from which data of a connected memory cell is to be sensed. In other words, the additional capacitance is not added to the reference bitline. The additional capacitance added to the bitline changes the rate at which its voltage rises relative to the other bitline (such as the reference bitline) that does not have the additional capacitance added to it.

Figure 21:
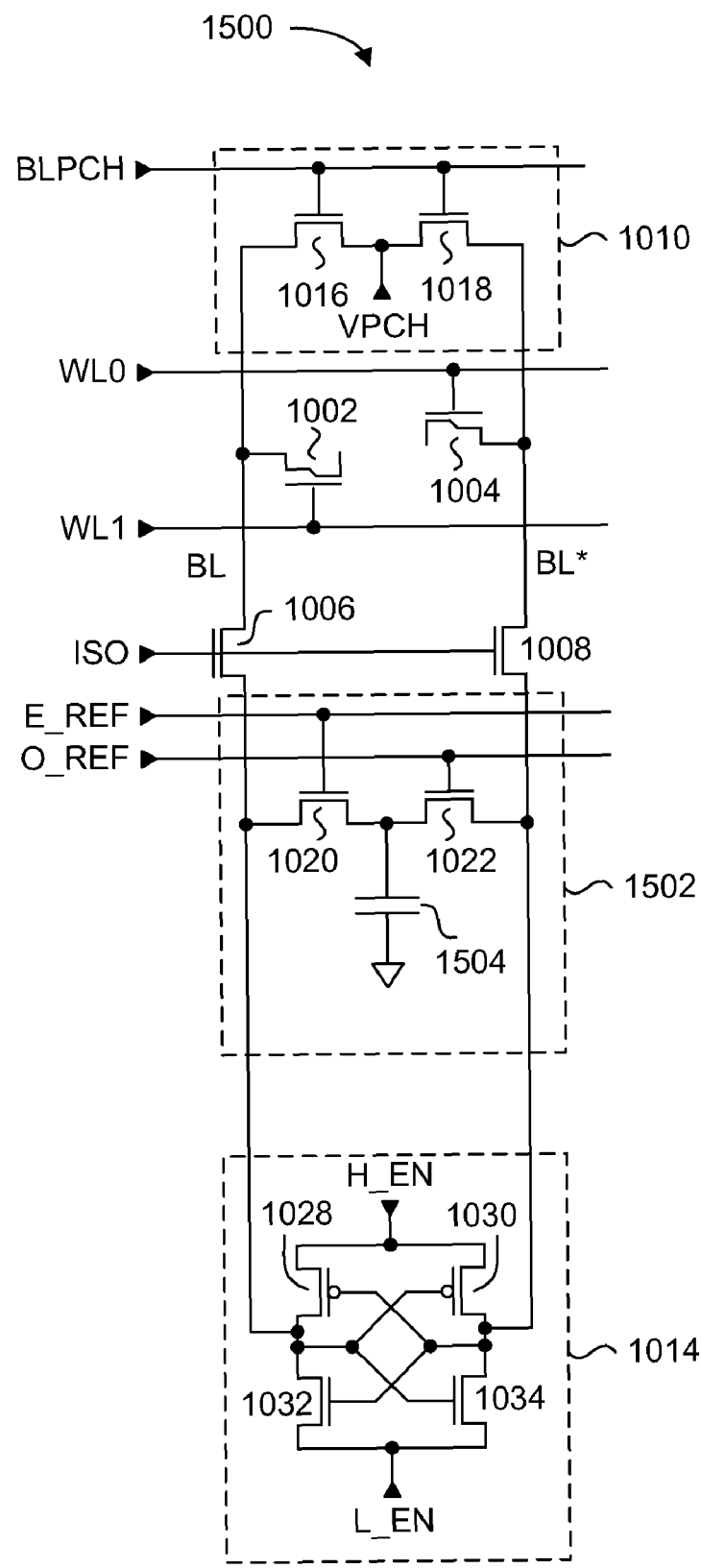
FIG. 21 is a circuit schematic of a folded bitline anti-fuse memory array having a capacitive loading reference charge circuit, according to embodiment of the present invention.

FIG. 21 is a schematic of the alternate folded bitline anti-fuse memory array according to the present embodiment of the invention. The alternate folded bitline anti-fuse memory array shown in FIG. 21 is similar to that shown in FIG. 16, but employs an alternate reference charge circuit that adds capacitance to the data bitline. Folded bitline anti-fuse memory array 1500 includes the same numbered elements as previously shown and described in FIG. 16, and hence no further description of these elements is required. Reference charge circuit 1502 includes previously described steering transistors 1020 and 1022, and a capacitance means 1504 connected to the shared source/drain terminal of transistors 1020 and 1022. The sensing operation of folded bitline anti-fuse memory array 1500 will now be described with reference to the flow chart of FIG. 22a and the timing diagram of FIG. 22b.

Figure 22A:
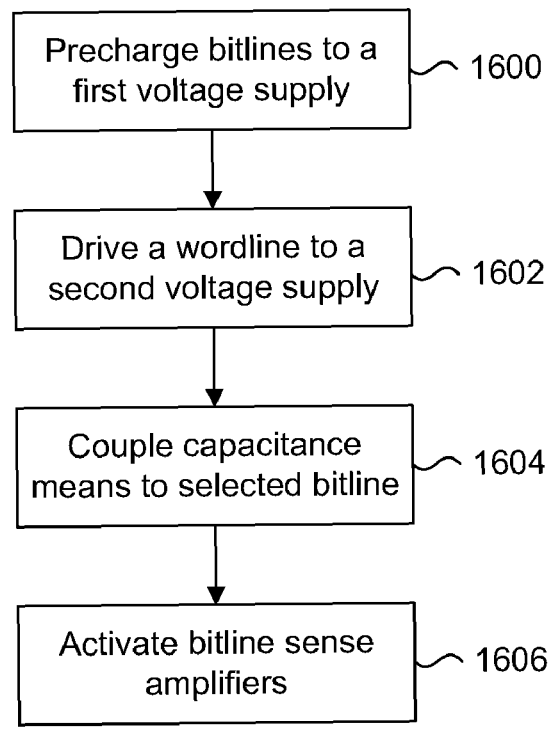
FIG. 22a is a flow chart showing an alternate method for sensing data using the folded bitline anti-fuse memory array of FIG. 21, according to an embodiment of the present invention.
Figure 22B:
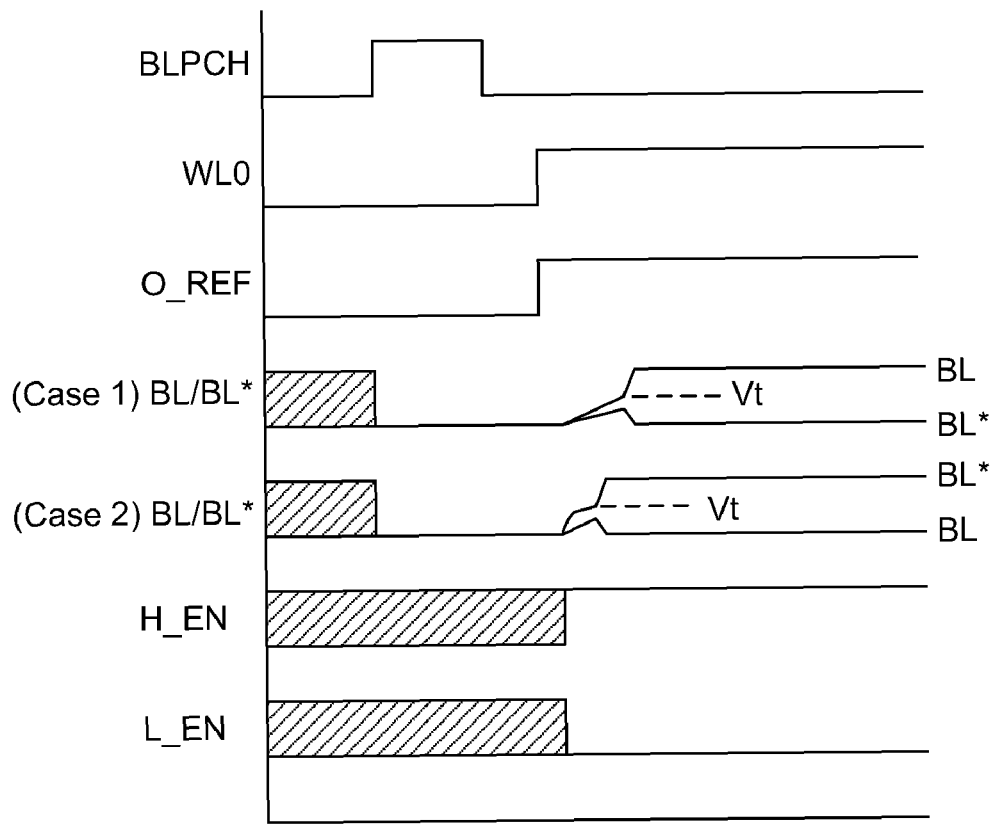

It is assumed that transistor 1004 is to be accessed (Case 1 shown in FIG. 22b), and is an unprogrammed anti-fuse memory cell which does not have a gate to drain conduction channel. In FIG. 22a, the sense operation starts at step 1600 where the bitlines are precharged to the first voltage supply, such as VSS for example. This corresponds to BLPCH pulsing high in FIG. 22b. Following at step 1602, a selected wordline is driven to a second voltage supply, such as VCC for example. Occurring concurrently with the selected wordline activation, but noted as step 1604, signal O_REF is raised to VCC to turn on steering transistor 1022. Hence the capacitance means 1504 is coupled to the same bitline that memory cell 1004 is connected to. At step 1606, the sense amplifiers are turned on by driving H_EN and L_EN to the high and low logic levels respectively. With both bitlines BL and BL* precharged to VSS, the p-channel transistors 1028 and 1030 of bitline sense amplifier will turn on and pull both BL and BL* towards H_EN. Since memory cell 1004 is non-conductive, both bitlines BL and BL* should rise at approximately the same rate.

However, since BL* has the additional capacitance means 1304 connected to it, it will rise at a slower rate relative to BL. Therefore, once BL rises to the threshold voltage level of the n-channel transistor 1034, bitline sense amplifier 1014 will fully latch and drive BL to the H_EN logic level and BL* to the L_EN logic level. The advantage of this present scheme is that no timing control over reference charge circuit 1502 is required. Preferably, the bitline sense amplifier 1014 is activated either at the same time, or shortly after the selected wordline WL0 and the proper steering signal are activated.

In contrast, if memory cell 1004 is a programmed anti-fuse memory cell having gate to drain conduction channel (Case 2 shown in FIG. 22b), BL* will rise to the threshold voltage level of n-channel transistor 1032 first. In Case 2 of FIG. 22b, the addition of the charge from the wordline WL0 memory cell 1004 will provide a positive offset on BL*. Once the bitline sense amplifier 1014 is activated, the p-channel transistors 1028 and 1030 will pull BL and BL* towards E_EN. While the rising rate of BL* is still slower than that of BL due to the added capacitance means 1504, the positive voltage offset is sufficient such that BL* will reach the n-channel transistor threshold voltage first. Hence, the bitline sense amplifier 1014 latches to a state opposite to the one in Case 1.

One issue with testing unprogrammed anti-fuse memory cells in a two cell/bit mode of operation, is that the bitline sense amplifiers will latch to unpredictable logic states. Since both BL and BL* start at a precharged VSS value, minor voltage variations or manufacturing variations can affect the bitline voltages, and hence sensing by the bitline sense amplifiers. Hence, the present scheme of adding capacitance to the data bitline will ensure that properly fabricated memory cells operating in a two cell/bit mode will be consistently sensed.

The previously described embodiments of the high speed sensing scheme for a folded bitline anti-fuse memory array, precharged the bitlines to VSS, followed by the application of a reference charge to a reference bitline or application of capacitance to a data bitline for sensing by a bitline sense amplifier. According to further embodiments of the present invention, the bitlines can be precharged to VCC instead of VSS.

Figure 23:
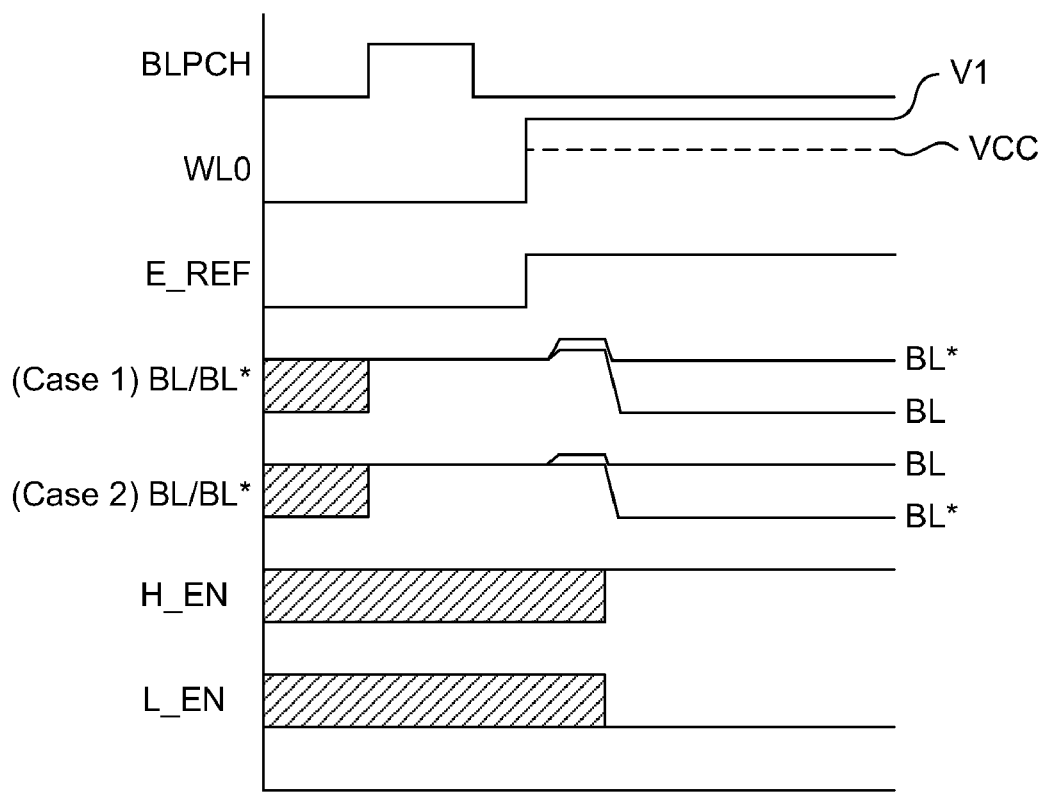
FIG. 23 is a timing diagram showing signal transitions in accordance with an alternate sensing method, according to an embodiment of the present invention.

The precharge-to-VCC sensing method according to an embodiment of the invention, can be executed with the folded bitline anti-fuse memory array of FIG. 16, and is similar to the sensing method outlined in FIG. 17a. The timing diagram of FIG. 23 shows traces for the control signals of FIG. 16 and of the bitlines BL and BL* for two different cases. In Case 1, the accessed memory cell connected to BL* is programmed. In Case 2, the accessed memory cell connected to BL* is unprogrammed.

The precharge-to-VCC embodiment using Case 1 is now described with reference to the timing diagram of FIG. 23. After both bitlines are precharged to a first voltage supply, such as VCC for example, a wordline such as WL0 is driven to a second voltage supply V1, such as VCC+1.5 volts for example. If the anti-fuse memory cell 1004 is programmed, then the wordline will pull bitline BL* up to a voltage of about VCC+100 millivolts. Then a reference charge is added to the reference bitline BL by activating E_REF, raising it to about VCC+50 millivolts for example. When the bitline sense amplifier is activated, the differential between the two bitlines is sensed and fully latched.

On the other hand, if the accessed memory cell 1004 is non-conductive as in Case 2, then the data bitline BL* will remain at VCC, which is lower than the reference (or unselected) bitline BL voltage of VCC+50 millivolts. Hence the bitline sense amplifier will latch the opposite state.

Figure 24:
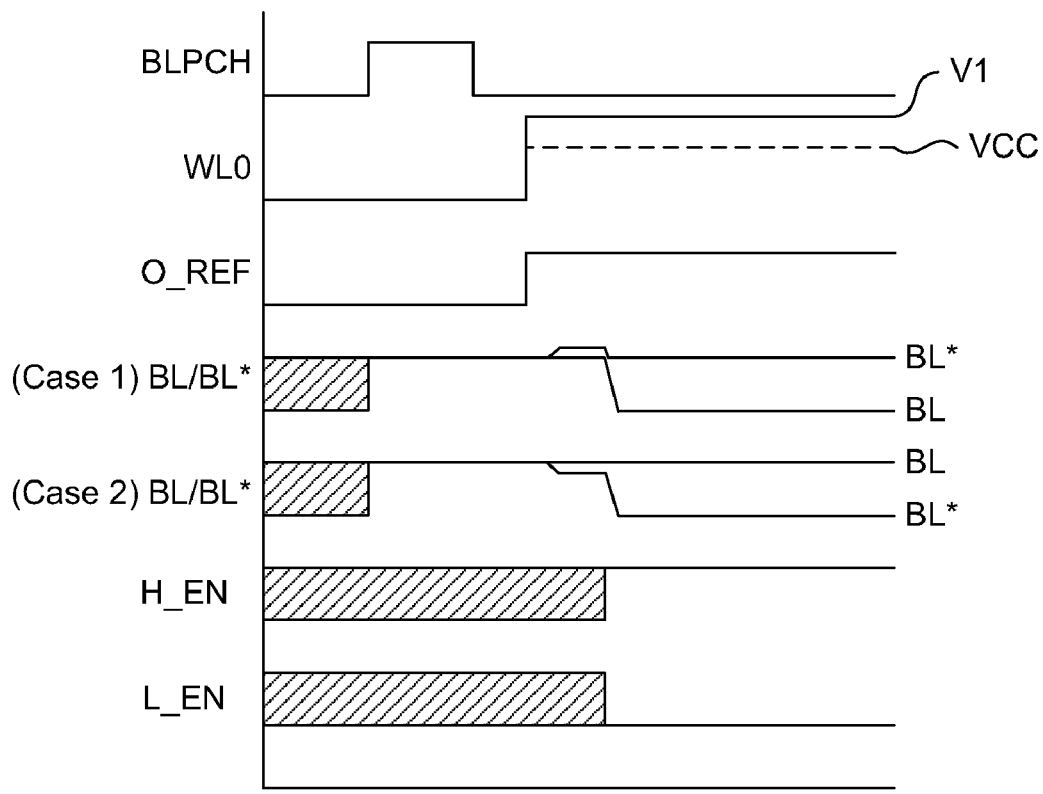
FIG. 24 is a timing diagram showing signal transitions in accordance with an alternate sensing method, according to an embodiment of the present invention.

In the previously described embodiment, a reference charge was added to the reference bitline. One disadvantage of this scheme is a high precharge voltage required for a reference charge. This is solved in an alternate precharge-to-VCC embodiment of the present invention, where a negative reference charge is added to the data bitline, which requires precharging the reference capacitor to ground. FIG. 24 is a timing diagram illustrating the relative voltage levels of BL and BL* of the present sensing embodiment for two different cases.

In Case 1, after both bitlines are precharged to a first voltage supply, such as VCC for example, a wordline such as WL0 is driven to a second voltage supply V1, such as VCC+1.5 volts for example. If the anti-fuse memory cell 1004 is programmed, then the wordline will pull bitline BL* up to a voltage of about VCC+100 millivolts. Then a negative reference charge is added to the data bitline BL* by activating O_REF, reducing it by 50 millivolts for example. The reference bitline BL remains at VCC. Therefore, when the bitline sense amplifier is activated, the differential between the data bitline and the reference bitline is sensed and fully latched.

On the other hand, if the accessed memory cell 1004 is non-conductive as in Case 2, then the data bitline BL* will drop to about VCC−50 millivolts, which is lower than the reference (or unselected) bitline BL voltage of VCC. Hence the bitline sense amplifier will latch the opposite state The previously illustrated sensing/testing scheme embodiments have been described with respect to memory arrays consisting of single transistor anti-fuse memory cells. Those skilled in the art will understand that the sensing/testing embodiments can be applied to memory arrays consisting of memory cells having two transistors, such as those illustrated in FIGS. 2 and 3, with the appropriate control over the cell plate voltage Vcp.

All the previously described embodiments are directed to circuits and methods for sensing data on bitlines of a memory array, and in particular folded bitlines of a memory array. Advances in semiconductor manufacturing and scaling allows for tight packing of bitlines in the memory array, thereby reducing the spacing between adjacent bitlines. This leads directly to an increase in capacitive coupling between the tightly packed bitlines, which can potentially cause read errors. An example of the bitline capacitive coupling effect is described with reference to FIG. 25.

Figure 25:
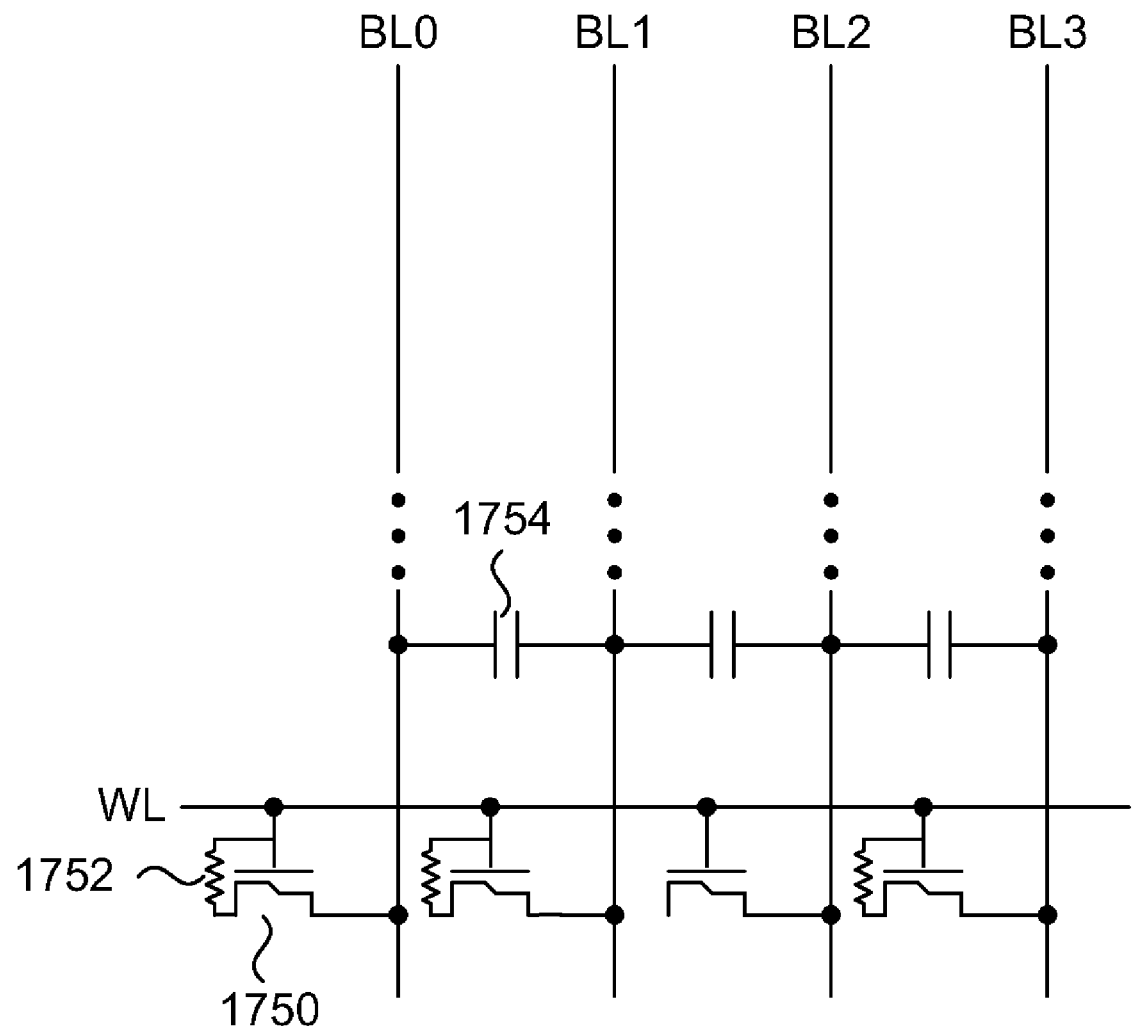
FIG. 25 is a circuit illustration of four metal bitlines connected to respective memory cells.

FIG. 25 is a circuit schematic of four metal bitlines, BL0, BL1, BL2 and BL3 in a tight packing arrangement, and memory cells connected to each of the bitlines. FIG. 25 is merely one example of a possible bitline configuration which uses the previously described single transistor anti-fuse transistor embodiment of the present invention, and those skilled in the art will understand that any memory cell, including the two transistor anti-fuse memory cell, can be used. In the presently shown example of FIG. 25, there are four anti-fuse memory cells 1750, of only one which is labeled, each having a drain diffusion terminal connected to a respective bitline, and gates connected to a wordline WL. The memory cells connected to BL0, BL1 and BL3 have been programmed, while the memory cell 1750 connected to BL2 is not programmed. In FIG. 25, a programmed anti-fuse memory cell 1750 has a resistor element 1752 connected between WL and its respective source terminal, to functionally illustrate the conductive link formed during programming of the anti-fuse cell.

According to one of the previously described sensing embodiments, the bitlines are precharged to VSS prior to a read operation. Then the wordline WL is driven to a high voltage level, and any memory cell 1750 having the conductive link (programmed) will charge its corresponding bitline towards the high voltage level. This will happen to bitlines BL0, BL1 and BL3. However, the memory cell connected to BL2 is not programmed, therefore BL2 should remain at the precharge voltage of VSS. Unfortunately, due to the capacitive coupling between adjacent bitlines, shown illustrated as capacitor 1754, the rising voltage of BL1 and BL3 adjacent to BL2 will pull BL2 towards the high voltage level. Therefore, sensing the data on BL2 will be erroneous. While having both bitlines adjacent to the data bitline represents the worst-case scenario, having even one adjacent bitline rising to the high voltage level can result in the same effect. Therefore, a new precharging scheme is required for reducing this bitline coupling effect.

Figure 26:
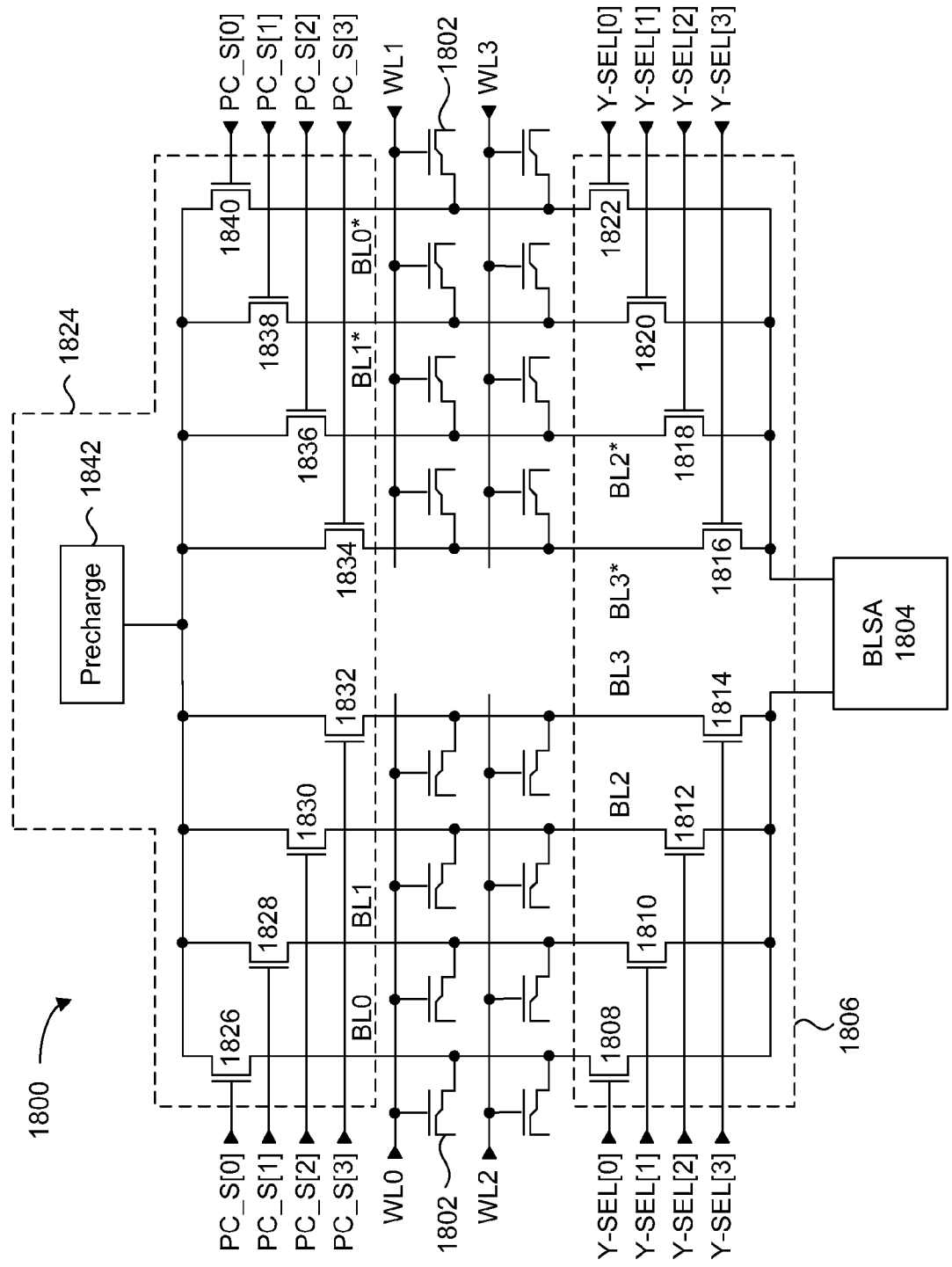
FIG. 26 is a circuit schematic of a folded bitline anti-fuse memory array having a column precharge circuit, according to an embodiment of the present invention.

FIG. 26 is a circuit schematic of an OTP memory array 1800 having a novel bitline precharge circuit for mitigating the above described bitline coupling effects, according to an embodiment of the present invention. In the present embodiment, bitlines adjacent to a data bitline for sensing by a bitline sense amplifier are precharged to a voltage level corresponding to the opposite logic state of the precharge voltage of the data bitline. The reference bitlines and the data bitlines can be called selected bitlines, while the remaining bitlines can be called unselected bitlines. In other words, if the data bitline is precharged to VSS, which corresponds to a logic "0", then its adjacent unselected bitlines are precharged to a high voltage level which corresponds to a logic "1". Alternately, the adjacent unselected bitlines can be precharged to a voltage level different than the previously described high voltage level. Therefore during sensing, the data bitline will rise towards the high voltage level if its corresponding memory cell is programmed, or it will stay at the precharged VSS voltage level, regardless of the programmed/unprogrammed states of memory cells connected to the adjacent bitlines.

In FIG. 26, OTP memory array 1800 includes n-channel single transistor anti-fuse memory cells 1802 as previously described in the embodiments of the present invention, preferably arranged in the folded bitline scheme. It is noted that OTP memory array 1800 is illustrated differently than in the previous figures, but is still functionally representative of a folded bitline configuration. It will be apparent to those skilled in the art that the proposed precharge scheme is applicable to any type of memory cell and bitline architecture. Complementary bitlines BL0/BL0*, BL1/BL1*, BL2/BL2* and BL3/BL3* are selectively coupled to a bitline sense amplifier 1804 through column select circuit 1806. Column select circuit 1806 is configured with n-channel column select devices 1808, 1810, 1812, 1814, 1816, 1818, 1820 and 1822. It is noted that the column select devices are paired due to the folded bitline configuration. For example, column select devices 1808 and 1822 are controlled by the same column select signal Y-SEL[0]. The remaining column select device pairs are controlled by column select signals Y-SEL[1], Y-SEL[2] and Y-SEL[3]. The operation of column select circuit 1806 and its n-channel column select devices is well known in the art. Based on a column address, a pair of column select devices are activated to couple one complementary bitline pair to bitline sense amplifier 1804 for sensing.

In order to selectively control precharge to particular bitlines according to the presently described embodiment of FIG. 26, a selective precharge circuit 1824 is provided. Selective precharge circuit 1824 is similar in configuration to column select circuit 1806, and includes n-channel column precharge devices 1826, 1828, 1830, 1832, 1834, 1836, 1838 and 1840 for coupling the bitlines to a precharge voltage circuit 1842. Similarly, the column precharge devices are paired such that one precharge selection signal, such as PC_S[0], will activate the pair of column precharge devices connected to a complementary pair of bitlines. For example, column precharge devices 1826 and 1840 form one such pair. The remaining pairs of column precharge devices are controlled by PC_S[1], PC_S[2] and PC_S[3]. For the present embodiment, the signals controlling each pair of column precharge devices and each pair of column select devices connected to the same bitlines are based on complementary column address signals (not shown). More specifically, PC_S[0] to PC_S[3] and Y-SEL[0] to Y-SEL[3] are generated with different decoding circuits, which use complementary column address signals and with different timing.

In one embodiment, the precharge voltage circuit 1842 can provide a predetermined precharge voltage level prior to a read operation. In another embodiment, the precharge voltage circuit 1842 can simply be the VCC voltage supply. In either embodiment, a primary precharge circuit similar to precharge circuit 1010 of FIG. 16 can integrated with the bitline sense amplifier circuit 1804 for precharging only the selected bitlines to VSS prior to the read operation.

According to a method of precharge operation according to an embodiment of the present invention, the column precharge devices of selective precharge circuit 1824 and the column select devices are activated simultaneously in a precharge phase such that the selected bitlines are precharged to VSS while the bitlines adjacent to the selected bitlines are precharged to the high voltage level. The control over the specific bitlines to precharge to the high voltage level during the precharge phase can be achieved by controlling signals PC_S[0] to PC_S[3]. Following the precharge phase is a read phase where the selected wordline is activated, the appropriate reference charge is added to the reference bitlines, and both the data bitlines and the reference bitlines are coupled to the bitline sense amplifier 1804 for data sensing.

Figure 27:
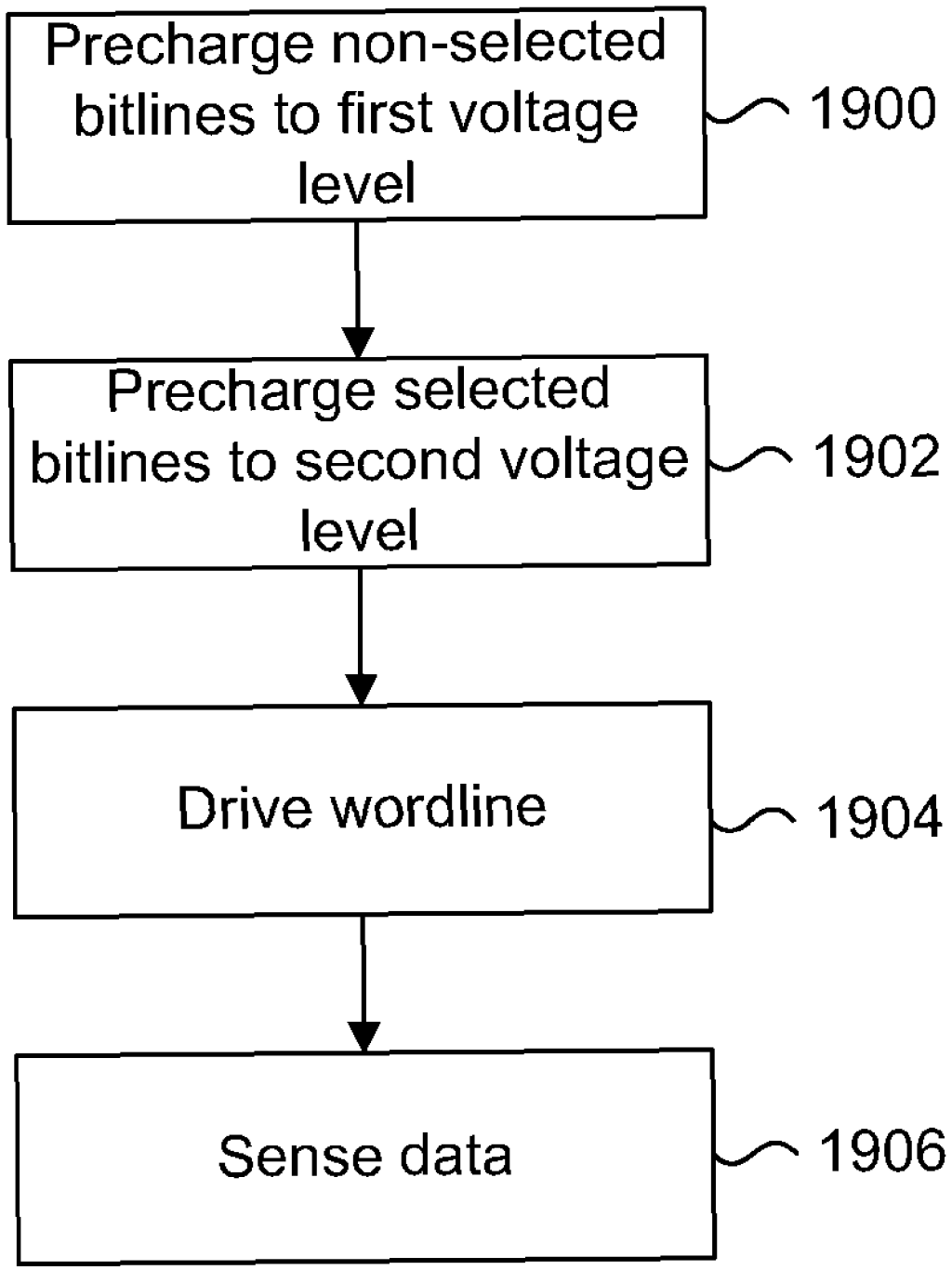
FIG. 27 is a flow chart showing a method of precharging the bitlines of the folded bitline anti-fuse memory array of FIG. 26, according to an embodiment of the present invention.

An example operation of the selective precharge circuit 1824 according to a preferred embodiment of the invention will now be described with reference to the circuit of FIG. 26, and the flow chart of FIG. 27. It is assumed that WL1 will be activated for a read operation, and that the memory cells connected to WL1 and to BL3*, BL2* and BL0* are programmed while the memory cell connected to WL1 and to BL1* is not programmed. In step 1900, all the column precharge devices of selective precharge circuit 1824, except devices 1828 and 1838 are activated to precharge all bitlines except BL1 and BL1* to the high voltage level.

Occurring concurrently at step 1902, only column select devices 1810 and 1820 will be turned on by driving Y-SEL[1] to a high logic level while the precharge to VSS circuit in BLSA 1804 is activated. Due to the column decoding scheme based on complementary column addresses, devices 1828 and 1838 are turned off while devices 1826, 1830, 1832, 1834, 1836 and 1838 are turned on. Therefore, the unselected bitlines adjacent to selected bitlines BL1/BL1* are driven to the high voltage level while the selected bitlines are driven to VSS. Now WL1 can be driven to the high voltage level at step 1904. BL1 can be the reference bitline in a single ended sensing scheme, but can be the complementary bitline in a two cell per bit sensing scheme. Then at step 1906, the bitline sense amplifier 1804 can be activated to sense the voltage differential on BL1/BL1*.

As previously noted, signals PC_S[0] to PC_S[3] and Y-SEL[0] to Y-SEL[3] are signals that are decoded in complementary fashion, but they are not the inverse of each other. In a practical implementation of the embodiments of the invention, precharging of the unselected bitlines should end before activation of the wordlines by turning off the column precharge devices, while keeping the proper column select devices turned on. Once sensing is finished, precharging of the unselected bitlines can then resume. Therefore, appropriate timing control can be implemented to achieve this desired operation. Furthermore, control over signals PC_S[0] to PC_S[3] and Y-SEL[0] to Y-SEL[3] can be based in part on changes to the column address. For example, in circumstances where subsequent read cycles use the same column address, the selected bitlines would be precharged to VSS while the remaining unselected bitlines are precharged to the high voltage level. Conversely, if the column address is changing between read cycles, all the bitlines can be precharged to the high voltage level at the end of one read cycle. Then the selected bitlines are precharged from the high voltage level to VSS when the new column address signal (Y-SEL [0] to Y-SEL[3]) has been activated.

It should be understood that the presently described bitline precharge embodiment can be used in combination with any of the previously described bitline sensing schemes.

Figure 28:
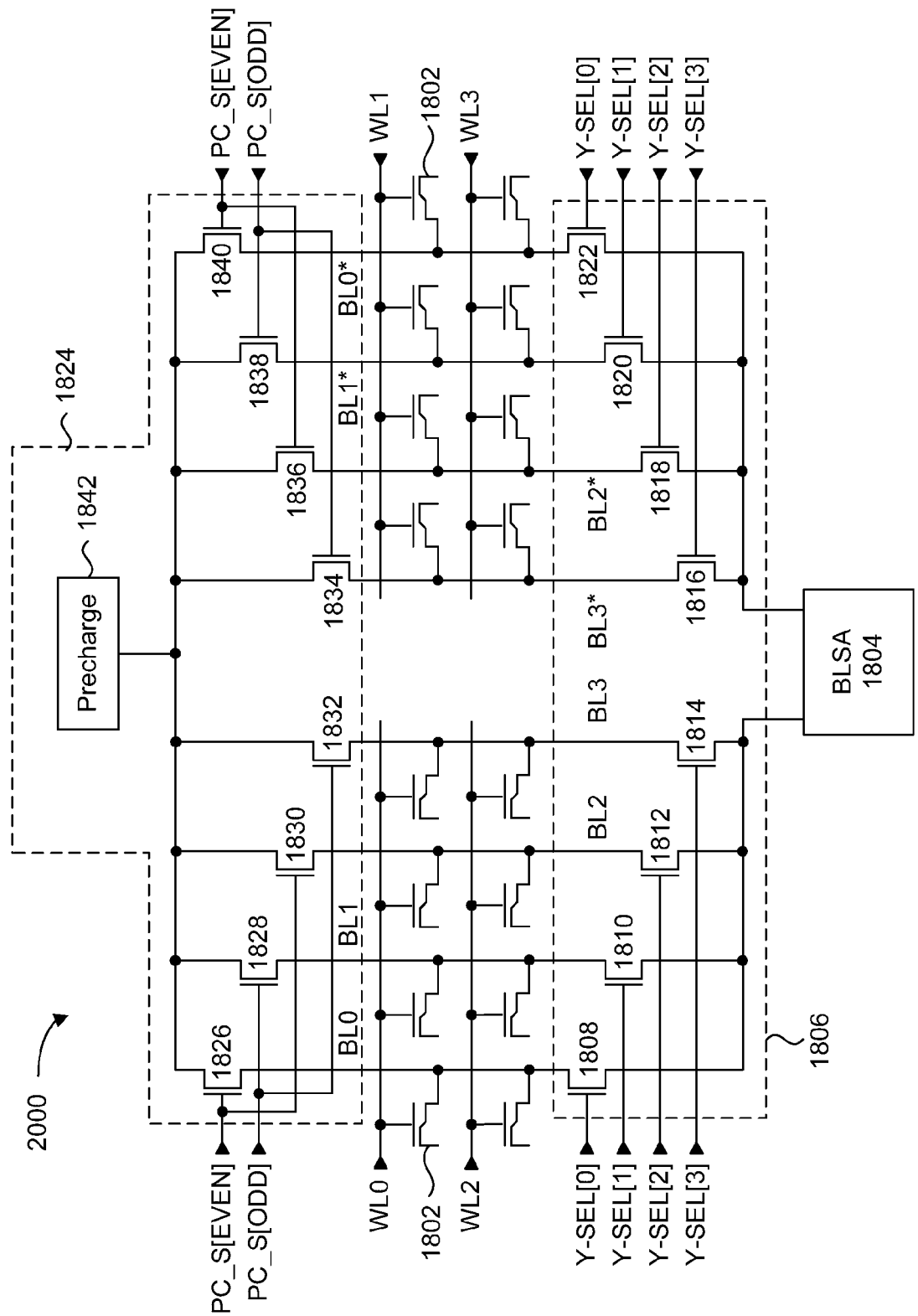
FIG. 28 is a circuit schematic of a folded bitline anti-fuse memory array having an alternate column precharge circuit, according to an embodiment of the present invention.

Therefore, as illustrated in the embodiment of FIG. 26, precharging all bitlines except the data bitline and the reference bitline to the high voltage level will minimize the bitline capacitance coupling effect, since the unselected bitlines will remain at the precharged high voltage level regardless of the programmed/unprogrammed states of the memory cells connected thereto. In the presently described embodiment, of a group of four bitlines, three bitlines will be precharged to the high voltage level. This can be a source of power consumption since many of the bitlines are precharged from VSS to VDD in preparation for the next read operation. Since only the bitlines immediately adjacent to selected bitlines need to be precharged to the high voltage level, any non-adjacent and unselected bitlines can remain precharged to VSS during the first and the second precharge phases. An alternate bitline precharge embodiment for conserving bitline power consumption is shown in FIG. 28.

The OTP memory array 2000 is identical to the OTP memory array 1800 shown in FIG. 26, except for the control connections of the column precharge devices. In particular, the gate terminals of column precharge devices 1826, 1830, 1836 and 1840 are connected to even precharge select signal PC_S[EVEN] decoded for even columns, and the gate terminals of column precharge devices 1828, 1832, 1834 and 1838 are connected to odd precharge select signal PC_S[ODD] decoded for odd columns. This simplified decoding scheme will minimize the number of bitlines that need to be precharged to the high voltage level during the precharge phase. Therefore, power consumption is reduced. Using the same example described above for FIG. 26, when PC_S[ODD] is driven to the low logic level, column precharge devices 1828, 1832, 1834 and 1838 will turn off. Although bitlines BL3/BL3* are unselected, they are not driven to the high voltage level during the precharge phase.

Persons skilled in the art will understand that column address decoding can easily be configured for achieving the previously described control functionality for the column access devices and precharge access devices. The precharge voltage levels can be further optimized to minimize power consumption while providing enough protection against the bitline coupling effect.

The previously described embodiments of the invention can be combined with each other, to realize the benefits and advantages afforded by each circuit or method. For example, the bitline precharge scheme shown in FIGS. 25 to 27 can be combined with the sensing scheme shown in FIG. 16.

The previously described embodiments of the anti-fuse transistor can be fabricated using standard CMOS processes, where its specific structures can be formed by simple mask manipulation. Accordingly, the above-described anti-fuse transistors and memory array can be manufactured at low cost either as p-type or n-type antifuses.

While the embodiments of the present invention are described with respect to single polysilicon gate anti-fuse transistor cells, the aforementioned teachings can apply to metal gate devices, and dual-gate structures similar to that shown in FIGS. 2 and 3. In such an embodiment, the gate 14 would be formed over a thick gate oxide portion, while top plate 16 would be formed over a thin gate oxide portion. Oxide breakdown is enhanced through the previously discussed techniques, such as high voltage diffusion doping and salicidation with RPO formation. Accordingly, the fusible edge would be located at the common edge of the thin gate oxide under top plate 16 and diffusion region 22, while the access edge would be located at the common edge of the thick oxide under gate 14 and diffusion region 24.

Those skilled in the art will understand that the embodiments of the invention equally applies to all other bulk MOS, thin film and SOI technologies including DRAM, EPROM, EEPROM and Flash, using either SiO2 or other gate dielectrics. Furthermore, persons of skill in the art can easily adopt the previously described p-channel devices to n-channel devices, either using isolated p-well and negative bias, or utilizing positive voltages only.

The anti-fuse structures of present invention can be utilized in all one time programmable applications, including RF-ID tags. RF-ID tagging applications are gaining more acceptance in the industry, particularly in sales, security, transport, logistics, and military applications for example. The simplicity and full CMOS compatibility of the presently described anti-fuse transistor invention allows for application of the RF-ID tag concept to integrated circuit manufacturing and testing process. Therefore, IC manufacturing productivity can be increased by utilizing the split-channel anti-fuse tag in combination with an RF communication interface on every wafer and/or every die on the wafer allowing for contact-less programming and reading chip specific or wafer specific information during IC manufacturing and packaging, as well as during printed circuit board assembly.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A memory array including one-time-programmable (OTP) memory cells, comprising
   a pair of complementary bitlines, each bitline of the pair of complementary bitlines being connected to diffusion terminals of the OTP memory cells;
   a precharge circuit for precharging the pair of complementary bitlines to a first voltage level, the precharge circuit including column precharge devices for selectively precharging bitlines adjacent to each bitline of the pair of complementary bitlines to a second voltage level different than the first voltage level;
   wordlines connected to gate terminals of the OTP memory cells, at least one wordline for driving one bitline of the pair of complementary bitlines to a third voltage level through a programmable conductive link of a corresponding OTP memory cell;
   a bitline sense amplifier for sensing a voltage differential on the pair of complementary bitlines; and,
   a reference circuit for selectively providing a reference charge to one bitline of the pair of complementary bitlines.

2. The memory array of claim 1, wherein each of the OTP memory cells is a single transistor anti-fuse memory cell.

3. The memory array of claim 1, wherein each of the OTP memory cells is a two transistor anti-fuse memory cell, the two transistor anti-fuse memory cell having an access transistor connected to the wordline and an anti-fuse device connected to the access transistor, said antifuse device having a gate connected to a secondary wordline, where the wordline and the secondary wordline are connected together electrically or logically during a read operation.

4. The memory array of claim 1, wherein the reference circuit includes a charge storage capacitor circuit and steering circuits for coupling the charge storage capacitor circuit to the one bitline of the pair of complementary bitlines.

5. The memory array of claim 4, wherein the steering circuits include dummy memory cells for selectively coupling the charge storage capacitor to the one bitline of the pair of complementary bitlines.

6. The memory array of claim 4, wherein the reference circuit includes a plurality of additional capacitor circuits connected to the charge storage capacitor circuit, each of the additional capacitor circuits being selectively enabled in response to a corresponding control signal.

7. A memory array including one-time-programmable (OTP) memory cells, comprising
a pair of complementary bitlines, each bitline of the pair of complementary bitlines being connected to diffusion terminals of the OTP memory cells;
a precharge circuit for precharging the pair of complementary bitlines to a first voltage level, the precharge circuit including column precharge devices for selectively precharging bitlines adjacent to each bitline of the pair of complementary bitlines to a second voltage level different than the first voltage level;
wordlines connected to gate terminals of the OTP memory cells, at least one wordline for driving one bitline of the pair of complementary bitlines to a third voltage level through a programmable conductive link of a corresponding OTP memory cell;
a bitline sense amplifier for sensing a voltage differential on the pair of complementary bitlines; and,
a reference circuit for selectively coupling a capacitive load means to one bitline of the pair of complementary bitlines during a bitline sensing operation.

8. The memory array of claim 7, wherein the reference circuit includes a steering circuit for coupling the capacitive load means to the one bitline of the pair of complementary bitlines during a bitline precharge operation.

* * * * *